(12) United States Patent
Wang

(10) Patent No.: US 8,497,181 B1
(45) Date of Patent: Jul. 30, 2013

(54) SEMICONDUCTOR DEVICE AND METHOD OF MANUFACTURING THE SAME

(71) Applicant: Fujitsu Semiconductor Limited, Yokohama (JP)

(72) Inventor: Wensheng Wang, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/716,177

(22) Filed: Dec. 16, 2012

Related U.S. Application Data

(60) Division of application No. 13/108,230, filed on May 16, 2011, now Pat. No. 8,357,585, which is a division of application No. 12/239,332, filed on Sep. 26, 2008, now Pat. No. 7,964,904, which is a continuation of application No. PCT/JP2006/306654, filed on Mar. 30, 2006.

(51) Int. Cl.
*H01L 21/02* (2006.01)

(52) U.S. Cl.
USPC ............... 438/396; 438/250; 438/393; 438/3; 438/329

(58) Field of Classification Search
USPC ................................ 438/396, 250, 393, 3, 329
See application file for complete search history.

(56) References Cited

U.S. PATENT DOCUMENTS

| | | | |
|---|---|---|---|
| 6,316,797 B1 * | 11/2001 | Van Buskirk et al. | 257/295 |
| 6,573,542 B2 | 6/2003 | Bruchhaus et al. | |
| 6,635,497 B2 | 10/2003 | Aggarwal et al. | |
| 6,906,367 B2 | 6/2005 | Matsuura et al. | |
| 7,135,732 B2 * | 11/2006 | Iwasaki et al. | 257/302 |
| 7,217,970 B2 | 5/2007 | Marsh | |
| 7,368,298 B2 | 5/2008 | Wang | |
| 7,462,898 B2 | 12/2008 | Ozaki | |
| 7,473,949 B2 | 1/2009 | Cross et al. | |
| 2002/0117700 A1 | 8/2002 | Fox | |

(Continued)

FOREIGN PATENT DOCUMENTS

| | | |
|---|---|---|
| JP | 2003-68991 A | 3/2003 |
| JP | 2003-128419 A | 5/2003 |
| JP | 2005-183841 A | 7/2005 |
| WO | WO-2004-053991 A1 | 6/2004 |

OTHER PUBLICATIONS

International Search Report of PCT/JP2006/306654, mailing date of Apr. 25, 2006.

(Continued)

*Primary Examiner* — Eugene Lee
(74) *Attorney, Agent, or Firm* — Fujitsu Patent Center

(57) ABSTRACT

An FeRAM is produced by a method including the steps of forming a lower electrode layer, forming a first ferroelectric film on the lower electrode layer, forming on the first ferroelectric film a second ferroelectric film in an amorphous state containing iridium inside, thermally treating the second ferroelectric film in an oxidizing atmosphere to crystallize the second ferroelectric film and to cause iridium in the second ferroelectric film to diffuse into the first ferroelectric film, forming an upper electrode layer on the second ferroelectric film, and processing each of the upper electrode layer, the second ferroelectric film, the first ferroelectric film, and the lower electrode layer to form the capacitor structure. With such a structure, the inversion charge amount in a ferroelectric capacitor structure is improved without increasing the leak current pointlessly, and a high yield can be assured, thereby realizing a highly reliable FeRAM.

2 Claims, 27 Drawing Sheets

U.S. PATENT DOCUMENTS

| | | | |
|---|---|---|---|
| 2003/0092203 A1* | 5/2003 | Murai | 438/3 |
| 2005/0136555 A1 | 6/2005 | Wang | |
| 2005/0156216 A1 | 7/2005 | Cross et al. | |
| 2006/0252223 A1 | 11/2006 | Nakayama | |
| 2006/0278954 A1 | 12/2006 | Izumi | |
| 2009/0057737 A1 | 3/2009 | Boescke et al. | |
| 2009/0061538 A1 | 3/2009 | Heo et al. | |
| 2009/0075400 A1 | 3/2009 | Tamura | |

OTHER PUBLICATIONS

Notification of Transmittal of Translation of the International Preliminary Report on Patentability (Form PCT/IB/338) of International Application No. PCT/JP2006/306654 mailed Oct. 30, 2008 with Form PCT/ISA/237.

USPTO, [Wilson] "U.S. Appl. No. 12/239,332 (grand-parent)," [CTNF] Non-Final Rejection mailed on Oct. 5, 2010.

USPTO, [Wilson] "U.S. Appl. No. 12/239,332 (grand-parent)," [CTRS] Requirement for Restriction/Election mailed on Aug. 20, 2010.

USPTO, [Wilson] "U.S. Appl. No. 12/239,332 (grand-parent)," [NOA] Notice of Allowance and Fees Due mailed on Mar. 8, 2011.

USPTO [Lee] "U.S. Appl. No. 13/108,230 (parent)," [CTRS] Restriction Requirement mailed Jul. 30, 2012.

USPTO [Lee] "U.S. Appl. No. 13/108,230 (parent)," [NOA] Notice of Allowance and Fees Due mailed on Oct. 9, 2012.

* cited by examiner

FER-AN1 TEMPERATURE-LOW

FER-AN1 TEMPERATURE-MIDDLE

SEMICONDUCTOR DEVICE AND METHOD OF MANUFACTURING THE SAME

CROSS-REFERENCE TO RELATED APPLICATIONS

This application is a Divisional of Ser. No. 13/108,230, filed May 16, 2011 which is a Divisional of Ser. No. 12/239,332, filed Sep. 26, 2008, now U.S. Pat. No. 7,964,904, which is a Continuation of International Application No. PCT/JP2006/306654, with an international filing date of Mar. 30, 2006, which designating the United States of America, the entire contents of which are incorporated herein by reference.

FIELD

The present embodiment relates to a semiconductor device having a capacitor structure in which a capacitor film constituted of a dielectric material is sandwiched between a lower electrode and an upper electrode, and is particularly suitable when applied to a ferroelectric capacitor structure in which the capacitor film is constituted of a ferroelectric material.

BACKGROUND

In recent years, development of ferroelectric memory (FeRAM: ferroelectric random access memory), which retains information in a ferroelectric capacitor structure using polarization inversion of a ferroelectric, is in progress. Ferroelectric memory is a non-volatile memory in which the retained information does not disappear when power is turned off, and is attracting attention particularly because realization of high integration, high-speed drive, high durability, and low power consumption can be expected with it.

The structure of a capacitor used for a memory cell of FeRAM has a structure in which, as described in Patent Documents 1 to 3 which will be described below, an SBT film or a PZT film for example is used as a ferroelectric film, and the ferroelectric film is sandwiched by a lower electrode and an upper electrode. A platinum film for example is used as the lower electrode, and a platinum film, an iridium oxide film, or the like for example is used as the upper electrode.

Patent Document 1 discloses an approach which, for suppressing separation and mutual diffusion of constituting elements of the ferroelectric film, does not perform high-temperature thermal treatment between the step of crystallizing the ferroelectric film completely to the step of forming a protection film of the capacitor structure. Specifically, PZT, which is a ferroelectric, is used first as a material to form a capacitor film, and thereafter this film is crystallized by RTA (Rapid Thermal Annealing) method. Subsequently, $IrO_x$ (0<x<2) is used as a material to form the upper electrode, and RTA method is further performed to crystallize the capacitor film completely. Simultaneously, iridium (Ir) in the upper electrode is made to diffuse into the PZT. According to this approach, it is possible to prevent the mutual diffusion between the electrodes and the ferroelectric film as well as separation of the constituting elements of the ferroelectric film.

Patent Document 2 discloses an approach which, for improving the crystallinity of a ferroelectric film of a stack-type capacitor structure, stacks an iridium film and an iridium oxide film to form the lower electrode. Thereafter, a first PZT film is formed, and a second PZT film thicker than the first PZT film is formed further.

Patent Document 3 discloses an approach which, for forming the ferroelectric film in which crystallization is facilitated at a low temperature of 650° C. or below, adds heteropoly acid to an organic metallic compound coating solution of SBT, PZT, or the like.

Patent Document 1: Japanese Patent Application Laid-open No. 2005-183841

Patent Document 2: Japanese Patent Application Laid-open No. 2003-68991

Patent Document 3: Japanese Patent Application Laid-open No. 2003-128419

SUMMARY

As clarified particularly in Patent Document 1, in conventional FeRAM manufacturing methods, there is proposed a technique to form the upper electrode from $IrO_x$ (0<x<2) on a capacitor film constituted of a ferroelectric material, and to perform thereafter annealing treatment so as to make iridium diffuse into the capacitor film.

When iridium diffuses into the capacitor film, it combines into crystal grains of the ferroelectric (A site or B site in the case of $ABO_3$-type perovskite structure), and inversion charge amount of the capacitor structure increases, resulting in a state that a leak current is increased slightly. However, when the iridium does not combine with the crystal grains, its stays in crystal grain boundaries, forms a leak path, and thereby the leak current in the capacitor increases rapidly. At the same time, the interface part (having no ferroelectricity) between the upper electrode and the capacitor film thickens, the inversion charge amount decreases, and a coercive electric field increases. Further, when a large number of crystal defects (holes) has occurred in the capacitor film, the iridium fills the crystal defects, and thereby the leak current increases drastically. As a result, there arises a problem that the yield of the FeRAM decreases significantly.

The present embodiment is made in view of the above-described problems, and an object thereof is to provide a highly reliable semiconductor device in which the inversion charge amount in the capacitor structure is improved without increasing the leak current pointlessly, and a high yield can be assured, and a method of manufacturing the same.

A semiconductor device according to the present embodiment includes a semiconductor substrate, and a capacitor structure formed above the semiconductor substrate and sandwiching a capacitor film constituted of a dielectric material by a lower electrode and an upper electrode, in which the capacitor film contains iridium inside and has an iridium concentration distribution in which an iridium concentration decreases with distance from an upper layer region toward a lower layer region.

A method according to the present embodiment of manufacturing a semiconductor device having a capacitor structure sandwiching a capacitor film constituted of a dielectric material by a lower electrode and an upper electrode above a semiconductor substrate includes, when forming the capacitor structure, the steps of forming a lower electrode layer, forming a first dielectric film on the lower electrode layer, forming on the first dielectric film a second dielectric film in an amorphous state containing iridium inside, thermally treating the second dielectric film in an oxidizing atmosphere to crystallize the second dielectric film and to cause iridium in the second dielectric film to diffuse into the first dielectric film, forming an upper electrode layer on the second dielectric film, and processing each of the upper electrode layer, the second dielectric film, the first dielectric film, and the lower electrode layer to form the capacitor structure.

Another aspect of a method according to the present embodiment of manufacturing a semiconductor device having a capacitor structure sandwiching a capacitor film constituted of a dielectric material by a lower electrode and an upper electrode above a semiconductor substrate includes, when forming the capacitor structure, the steps of forming a lower electrode layer, forming a dielectric film in an amorphous state on the lower electrode layer, performing first thermal treatment on the dielectric film in an oxidizing atmosphere to crystallize the dielectric film, forming on the dielectric film an upper electrode layer containing iridium inside, performing second thermal treatment on the upper electrode layer in an oxidizing atmosphere to cause iridium in the upper electrode layer to diffuse into the dielectric film, and processing each of the upper electrode layer, the dielectric film, and the lower electrode layer to form the capacitor structure.

According to the present embodiment, the inversion charge amount in a capacitor structure is improved without increasing the leak current pointlessly, and a high yield can be assured, thereby realizing a highly reliable semiconductor device.

Additional objects and advantages of the invention will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

DESCRIPTION OF EMBODIMENTS

Several Concrete Embodiments to which the Present Embodiment is Applied

Hereinafter, several concrete embodiments to which the present embodiment is applied will be explained in detail with reference to the drawings. In the several embodiments below, the case of applying the present embodiment to FeRAM will be exemplified, but the embodiment is also applicable to semiconductor memory using an ordinary dielectric film in a capacitor structure.

First Embodiment

In this embodiment, a so-called planar-type FeRAM is exemplified, in which conduction between a lower electrode and an upper electrode of a ferroelectric capacitor structure is realized on an upper side of the ferroelectric capacitor structure. Note that for the convenience of explanation, the structure of the FeRAM will be explained together with a method of manufacturing the same.

FIG. 1A to FIG. 5B are schematic cross-sectional views showing the structure of the FeRAM according to the first embodiment together with the method of manufacturing the same in order of steps.

Figure 1A:
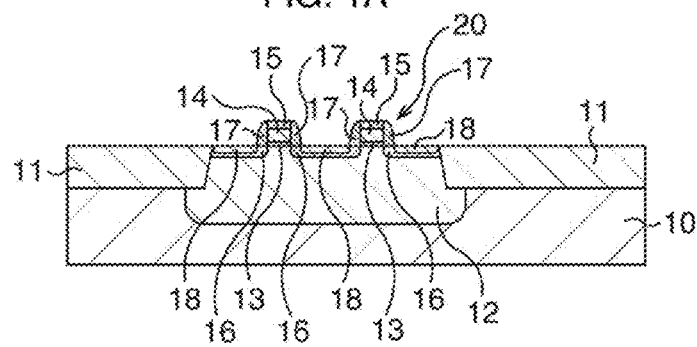
FIG. 1A is a schematic cross-sectional view showing the structure of an FeRAM according to a first embodiment together with a method of manufacturing the same in order of steps.

First, as shown in FIG. 1A, a MOS transistor 20 which functions as a selection transistor is formed on a silicon semiconductor substrate 10.

Specifically, an element isolation structure 11 is formed on a surface layer of the silicon semiconductor substrate 10 for example by STI (Shallow Trench Isolation) method, and an element active region is defined.

Next, impurity, here B, is ion implanted into the element active region under the condition of, for example, a dose amount of $3.0 \times 10^{13}/cm^2$ and acceleration energy of 300 keV, so as to form a well 12.

Next, a thin gate insulating film 13 with a film thickness of approximately 3.0 nm is formed by thermal oxidation or the like in the element active region, a polycrystalline silicon film with a film thickness of approximately 180 nm and a silicon nitride film with a thickness of approximately 29 nm for example are deposited by CVD method on the gate insulating film 13. The silicon nitride film, the polycrystalline silicon film, and the gate insulating film 13 are processed in an electrode form by lithography and subsequent dry etching, so as to pattern form gate electrodes 14 on the gate insulating film 13. At this time, simultaneously, cap films 15 each constituted of a silicon nitride film are pattern formed on the gate electrodes 14.

Next, with the cap films 15 being a mask, impurity, here As, is ion implanted into the element active region under the condition of, for example, a dose amount of $5.0 \times 10^{14}/cm^2$ and acceleration energy of 10 keV, so as to form so-called LDD regions 16.

Next, a silicon oxide film for example is deposited on the entire surface by CVD method, and so-called etching back is performed on this silicon oxide film, so as to leave the silicon oxide film only on side faces of the gate electrodes 14 and the cap films 15. Thus, side wall insulating films 17 are formed.

Next, with the cap films 15 and the side wall insulating films 17 being a mask, impurity, here P, is ion implanted into the element active region under the condition to make the impurity concentration higher than in the LDD regions 16 so as to form source/drain regions 18 which are overlapped with the LDD regions 16. Thus, the MOS transistor 20 is completed.

Figure 1B:
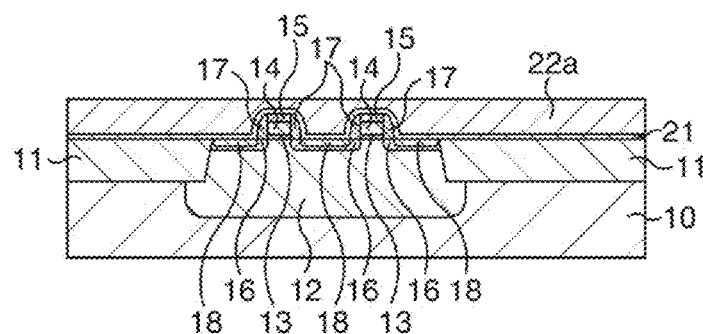
FIG. 1B is a schematic cross-sectional view showing the structure of the FeRAM according to the first embodiment together with the method of manufacturing the same in order of steps.

Subsequently, as shown in FIG. 1B, a protective film 21 and an interlayer insulating film 22a for the MOP transistor 20 are formed sequentially.

Specifically, the protective film 21 and the interlayer insulating film 22a are deposited sequentially so as to cover the MOS transistor 20. Here, as the protective film 21, a silicon oxide film is used as a material and is deposited with a film thickness of approximately 20 nm by CVD method. As the interlayer insulating film 22a, for example, there is formed a stacked structure in which a plasma SiO film (approximately 20 nm in film thickness), a plasma SiN film (approximately 80 nm in film thickness) and a plasma TEOS film (approximately 1000 nm in film thickness) are formed sequentially, and after stacking, the structure is polished until the film thickness thereof becomes approximately 700 nm by CMP.

Figure 1C:
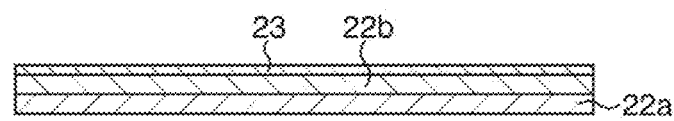
FIG. 1C is a schematic cross-sectional view showing the structure of the FeRAM according to the first embodiment together with the method of manufacturing the same in order of steps.

Subsequently, as shown in FIG. 1C, an interlayer insulating film 22b and a protective film 23 are formed sequentially. Note that in the views of FIG. 1C and so on, for the convenience of illustration, only the structure above the interlayer insulating film 22a is shown, and the illustration of the silicon semiconductor substrate 10, the MOS transistor 20, and so on is omitted.

Specifically, first, a silicon oxide film is deposited with a film thickness of approximately 100 nm on the interlayer insulating film 22a by plasma CVD method using TEOS for example, to thereby form the interlayer insulating film 22b. Thereafter, the interlayer insulating film 22b is anneal treated. The condition of this annealing treatment is such that it is performed for 20 minutes to 45 minutes at 650° C. for example while supplying $N_2$ gas at a flow rate of 20 litters/minute.

Next, on the interlayer insulating film 22b, the protective film 23 if formed, which functions as an adhering film of a ferroelectric capacitor structure which will be described later and is for preventing entrance of hydrogen/water to the ferroelectric film. As the protective film 23, alumina ($Al_2O_3$) is used as a material and deposited with a film thickness of approximately 20 nm to 50 nm by sputtering method. Instead of alumina, the protective film 23 may be a film of aluminum nitride, tantalum oxide, titanium oxide, zirconium oxide, or the like or a stacked structure of them. Thereafter, for improving the crystallinity of the lower electrode of the ferroelectric capacitor structure, the protective film 23 is anneal treated. The condition of this annealing treatment is such that it is performed for 30 seconds to 120 seconds, for example 60 seconds, at 650° C. for example while supplying $O_2$ gas at a flow rate of 2 litters/minute.

Figure 1D:
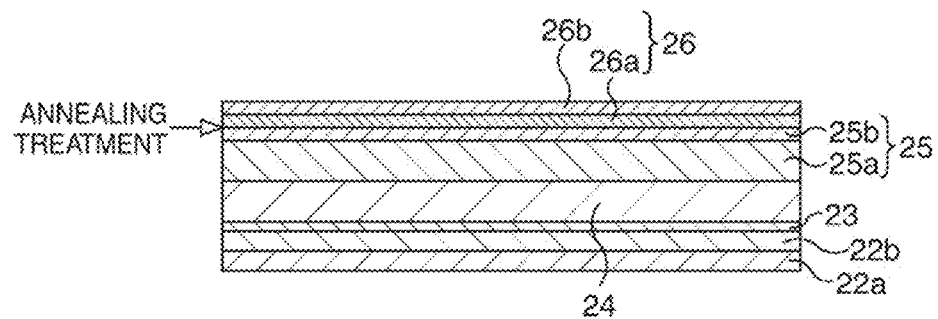
FIG. 1D is a schematic cross-sectional view showing the structure of the FeRAM according to the first embodiment together with the method of manufacturing the same in order of steps.

Subsequently, as shown in FIG. 1D, a lower electrode layer 24, a ferroelectric film 25 and an upper electrode layer 26 are formed sequentially.

Specifically, first, a Pt film is deposited with a film thickness of approximately 150 nm to 200 nm, here approximately 150 nm, for example by sputtering method, so as to form the lower electrode layer 24. To improve the crystallinity of Pt (111), it is desirable that the film is formed at a high temperature and by low power, for example at a substrate temperature of 350° C. or higher and by 0.3 kW. In addition, the material of the lower electrode layer 24 may be Ir, Ru, Rh, Re, Os, Pd, an oxide of one of them, and a conductive oxide such as $SrRuO_3$ or the like, or a stacked structure of them, instead of Pt.

Next, on the entire surface of the lower electrode layer 24, a first ferroelectric film 25a is formed by sputtering method for example. The first ferroelectric film 25a is formed using a ferroelectric material having an $ABO_3$-type perovskite structure (A=at least one selected from Bi, Pb, Ba, Sr, Ca, Na, K, and rare-earth elements, and B=at least one selected from Ti, Zr, Nb, Ta, W, Mn, Fe, Co, Cr), for example PZT as a material with a film thickness of approximately 70 nm to 250 nm, here approximately 120 nm. Note that a plurality of A atoms exist in one unit of the perovskite structure, but they are not always the same in each unit. The same also applies to the case of the B atoms.

As the material of the first ferroelectric film 25a, it is also possible to use, instead of PZT, one selected from PZT doped with at least one selected from La, Ca, Sr, and Si, PLZT, BLT, SBT, and Bi-layered structure (for example, one selected from $(Bi_{1-x}, R_x) Ti_3O_{12}$ (R is rare-earth element: $0<x<1$), $SrBi_2Ta_2O_9$, and $SrBi_4Ti_4O_{15}$). These dielectric materials are the $ABO_3$-type perovskite structure when seen as one unit.

Further, other than the ferroelectric material, a high-dielectric material such as Zr oxide, Pb-based material, or the like may be deposited.

Next, on the entire surface of the first ferroelectric film 25a, a second ferroelectric film 25b in an amorphous state is formed by sputtering method for example. The second ferroelectric film 25b is formed using a ferroelectric material having an $ABO_3$-type perovskite structure containing Ir elements in at least one of A site and B site (A=at least one selected from Bi, Pb, Ba, Sr, Ca, Na, K, and rare-earth elements, and B=at least one selected from Ti, Zr, Nb, Ta, W, Mn, Fe, Co, Cr), for example PZT as a material with a film thickness of approximately 1 nm to 30 nm, here approximately 20 nm. Note that a plurality of A atoms exist in one unit of the perovskite structure, but they are not always the same in each unit. The same also applies to the case of the B atoms.

The film thickness of the ferroelectric film 25b is desired to be 30 nm or smaller because a switching charge amount in the capacitor structure decreases easily when it is too thick, and here it is set to approximately 20 nm. Further, an Ir element content therein is desired to be approximately 0.01% to 3.00%. When the Ir element content becomes large, Ir elements are accumulated in the grain boundary in the second ferroelectric film 25b during thermal treatment thereafter, and a leak path of the capacitor structure is formed. Here, it is desirable that a PZT target of adding approximatley 1% of Ir is used to form the second ferroelectric film 25b.

As the material of the second ferroelectric film 25b to which Ir is added, it is also possible to use, instead of PZT, one selected from PZT doped with at least one selected from La, Ca, Sr, and Si, PLZT, BLT, SBT, and Bi-layered structure (for example, one selected from $(Bi_{1-x},R_x)Ti_3O_{12}$ (R is rare-earth element: $0<x<1$), $SrBi_2Ta_2O_9$, and $SrBi_4Ti_4O_{15}$). These dielectric materials are the $ABO_3$-type perovskite structure when seen as one unit.

Next, the second ferroelectric film 25b is thermally treated. Here, the thermal treatment is performed by RTA (Rapid Thermal Annealing) method in an oxidizing atmosphere, here an atmosphere including oxygen (mixed atmosphere of inert gas and oxygen). For example, the thermal treatment temperature is 550° C. to 800° C., here 580° C. for example, and the thermal treatment time is 30 seconds to 120 seconds, here 60 seconds, in the atmosphere with oxygen at a flow rate of 50 sccm and Ar at a flow rate of 2000 sccm. The suitable thermal treatment temperature is different depending on the type of a ferroelectric material. For example, it is desired that the thermal treatment temperature for PZT or minutely added PZT is 600° C. or below, 700° C. or below for BLT, and 800° C. or below for SBT.

By this thermal treatment, the second ferroelectric film 25b crystallizes, and Ir in the second ferroelectric film 25b combines with the A site and/or the B site of crystal grains in the first ferroelectric film 25a. Here, the ferroelectric film 25 to be a capacitor film is formed by the first ferroelectric film 25a and the second ferroelectric film 25b.

Next, by sputtering method or MOCVD method for example, an $IrO_x$ film ($0<x<2$) 26a for example with a film thickness of approximately 10 nm to 100 nm, here approximately 50 nm and an $IrO_y$ film ($0<y\leq 2$) 26b with a film thickness of approximately 100 nm to 300 nm are deposited sequentially, so as to form the upper electrode layer 26. At this time, to suppress deterioration of the capacitor structure in several subsequent steps, the composition ratio Y of oxygen in the $IrO_y$ film 26b is made to be higher than the composition ratio X of oxygen in the $IrO_x$ film 26a. By forming the $IrO_x$ film 26b in a composition close to the stoichiometric composition of $IrO_2$, it does not exhibit catalytic effect for hydrogen. Thus, a problem that the ferroelectric film is reduced by hydrogen radicals is suppressed, and hydrogen resistance of the capacitor structure improves. In addition, the material of the upper electrode layer 26 may be Ir, Ru, Rh, Re, Os, Pd, an oxide of one of them, and a conductive oxide such as $SrRuO_3$ or the like, or a stacked structure of them, instead of iridium oxide.

Figure 2A:
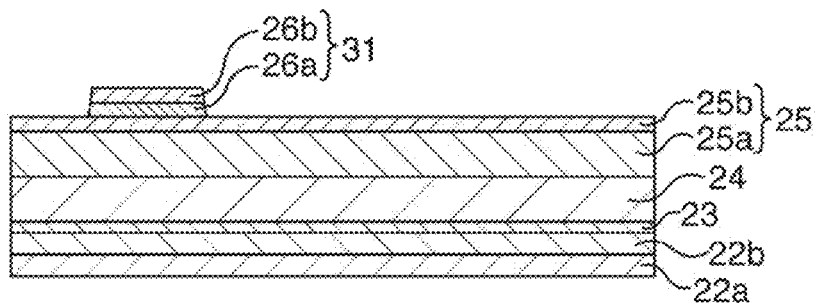
FIG. 2A is a schematic cross-sectional view showing the structure of the FeRAM according to the first embodiment together with the method of manufacturing the same in order of steps.

Subsequently, as shown in FIG. 2A, an upper electrode 31 is pattern formed.

Specifically, after back surface cleaning of the semiconductor substrate 10 is performed, the upper electrode layer 26 is processed in a plurality of electrode shapes by lithography and subsequent dry etching, thereby pattern forming the upper electrode 31.

Figure 2B:
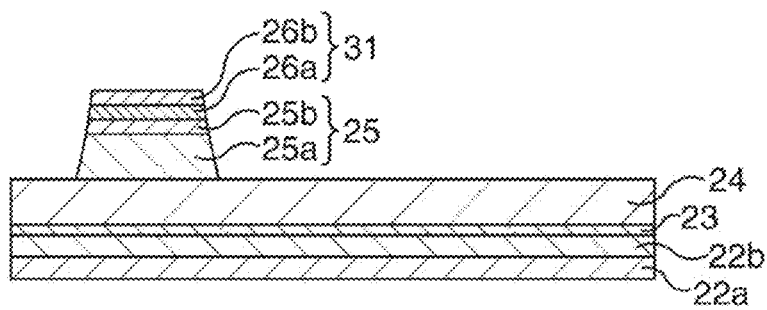
FIG. 2B is a schematic cross-sectional view showing the structure of the FeRAM according to the first embodiment together with the method of manufacturing the same in order of steps.

Subsequently, as shown in FIG. 2B, the ferroelectric film 25 is processed.

Specifically, the ferroelectric film 25 is matched with the upper electrode 31 and then processed by lithography and subsequent dry etching. After patterning of this ferroelectric film 25, the ferroelectric film 25 is anneal treated to recover the function of the ferroelectric film 25.

Figure 2C:
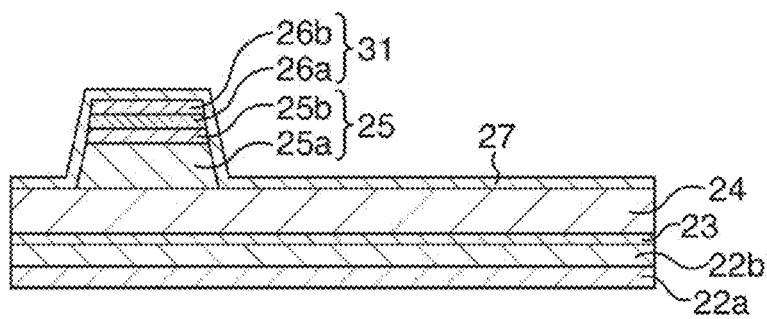
FIG. 2C is a schematic cross-sectional view showing the structure of the FeRAM according to the first embodiment together with the method of manufacturing the same in order of steps.

Subsequently, as shown in FIG. 2C, a protective film 27 for preventing entrance of hydrogen/water to the ferroelectric film 25 is formed.

Specifically, alumina ($Al_2O_3$) is used as a material and deposited on and above the lower electrode layer 24 with a film thickness of approximately 50 nm so as to cover the ferroelectric film 25 and the upper electrode 31 by sputtering method, thereby forming the protective film 27. Thereafter, the protective film 27 is anneal treated.

Figure 2D:
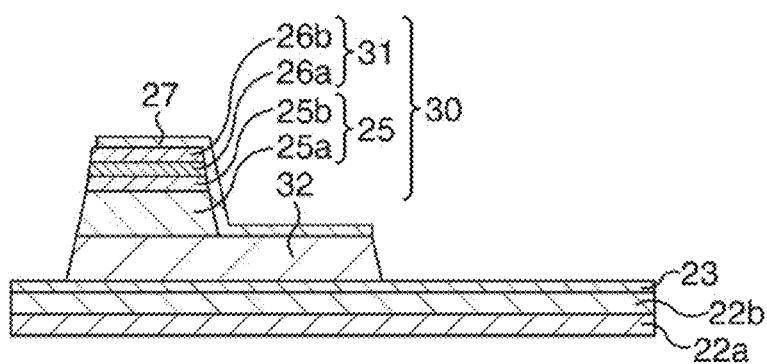
FIG. 2D is a schematic cross-sectional view showing the structure of the FeRAM according to the first embodiment together with the method of manufacturing the same in order of steps.

Subsequently, as shown in FIG. 2D, the lower electrode layer 24 is processed together with the protective film 27, thereby completing a ferroelectric capacitor structure 30.

Specifically, the protective film 27 and the lower electrode layer 24 are matched with the processed ferroelectric film 25 and are processed by lithograph and subsequent dry etching so that the lower electrode layer 24 remains larger in size than the ferroelectric film 25, thereby pattern forming the lower electrode 32. Accordingly, the ferroelectric film 25 and the upper electrode 31 are stacked sequentially on and above the lower electrode 32, thereby completing the ferroelectric capacitor structure 30 in which the lower electrode 32 and the upper electrode 31 are capacitively coupled via the ferroelectric film 25. At this time, simultaneously, the protective film 27 remains to cover from an upper face of the upper electrode 31, across side faces of the upper electrode 31 and the ferroelectric film 25, to an upper surface of the lower electrode layer 24. Thereafter, the protective film 27 is anneal treated.

In the ferroelectric capacitor structure 30 according to this embodiment, the ferroelectric film 25 contains iridium inside and has an iridium concentration distribution such that the iridium concentration gets lower with distance from an upper layer region toward a lower layer region.

Figure 6:
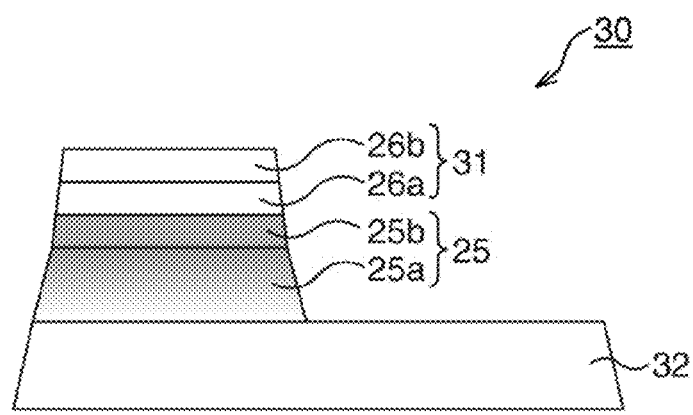
FIG. 6 is a schematic cross-sectional view showing a capacitor structure of the FeRAM according to the first embodiment.

Specifically, as shown in FIG. 6, there is formed an iridium concentration distribution such that the iridium concentration is even and high in an upper layer region of the ferroelectric film 25, namely the portion of the second ferroelectric film 25b, and the iridium concentration decreases in a downward direction in a lower layer region of the ferroelectric film 25, namely the portion of the first ferroelectric film 25a.

Figure 3A:
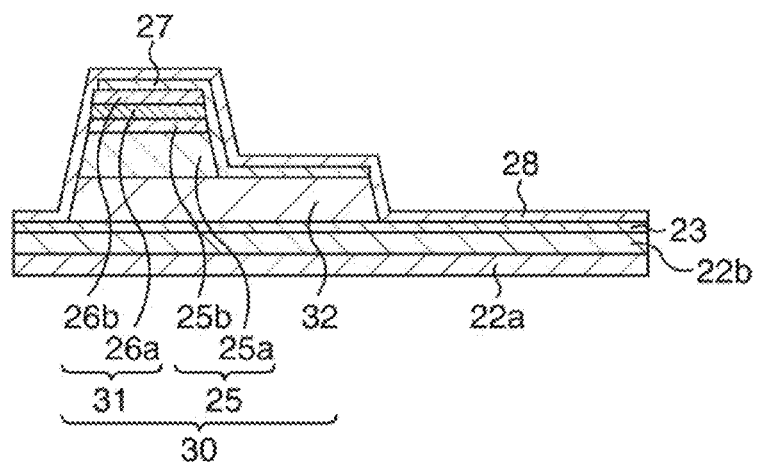
FIG. 3A is a schematic cross-sectional view showing the structure of the FeRAM according to the first embodiment together with the method of manufacturing the same in order of steps.

Subsequently, as shown in FIG. 3A, a protective film 28 is formed.

Specifically, alumina ($Al_2O_3$) is used as a material and deposited with a film thickness of approximately 20 nm to 50 nm so as to cover the entire surface of the ferroelectric capacitor structure 30 by sputtering method, thereby forming the protective film 28. Thereafter, the protective film 28 is anneal treated.

Figure 3B:
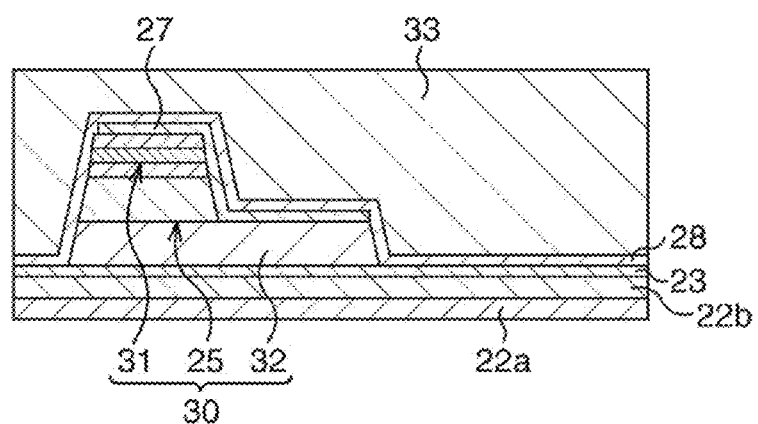
FIG. 3B is a schematic cross-sectional view showing the structure of the FeRAM according to the first embodiment together with the method of manufacturing the same in order of steps.

Subsequently, as shown in FIG. 3B, an interlayer insulating film 33 is formed.

Specifically, the interlayer insulating film 33 is formed so as to cover the ferroelectric capacitor structure 30 via the protective films 27, 28. Here, as the interlayer insulating film 33, a silicon oxide film is deposited with a film thickness of approximately 1500 nm to 2500 nm by plasma CVD method using TEOS for example, and thereafter it is formed by polishing until the film thickness thereof becomes approximately 1000 nm by CMP for example. After the CMP, for the purpose of dehydrating the interlayer insulating film 33, plasma annealing treatment of $N_2O$ for example is performed thereon.

Figure 3C:
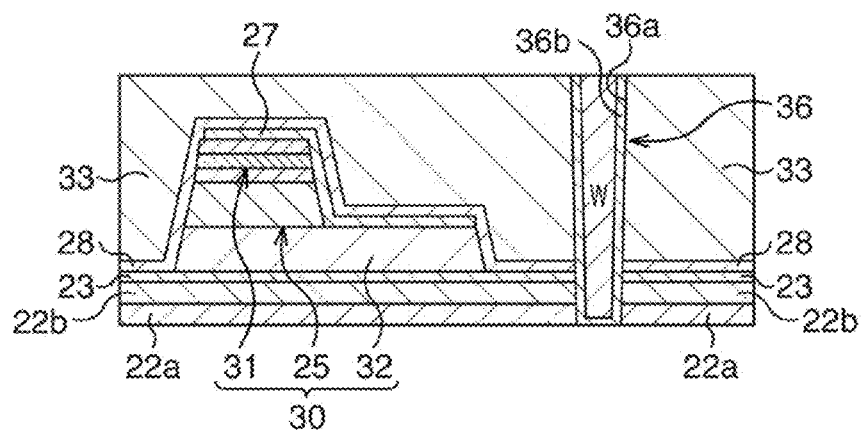
FIG. 3C is a schematic cross-sectional view showing the structure of the FeRAM according to the first embodiment together with the method of manufacturing the same in order of steps.

Subsequently, as shown in FIG. 3C, a plug 36 connected to the source/drain region 18 of the transistor structure 20 is formed.

Specifically, first, with the source/drain region 18 being an etching stopper, the interlayer insulating film 33, the protective films 28, 27, the interlayer insulating films 22b, 22a, and the protective film 21 are processed by lithography and subsequent dry etching until a portion of a surface of the source/drain region 18 is exposed, thereby forming a via hole 36a with a diameter of about 0.3 μm for example.

Next, a Ti film and a TiN film for example are deposited sequentially by sputtering method so as to cover a wall surface of the via hole 36a with a film thickness of approximately 20 nm and a film thickness of approximately 50 nm, thereby forming a base film (glue film) 36b. Then, a W film is formed for example so as to fill the via hole 36a via the glue film 36b by CVD method. Thereafter, the W film and the glue film 36b are polished by CMP with the interlayer insulating film 33 being a stopper, thereby forming the plug 36 filling the via hole 36a with W via the glue film 36b. After the CMP, plasma annealing treatment of $N_2O$ for example is performed thereon.

Figure 4A:
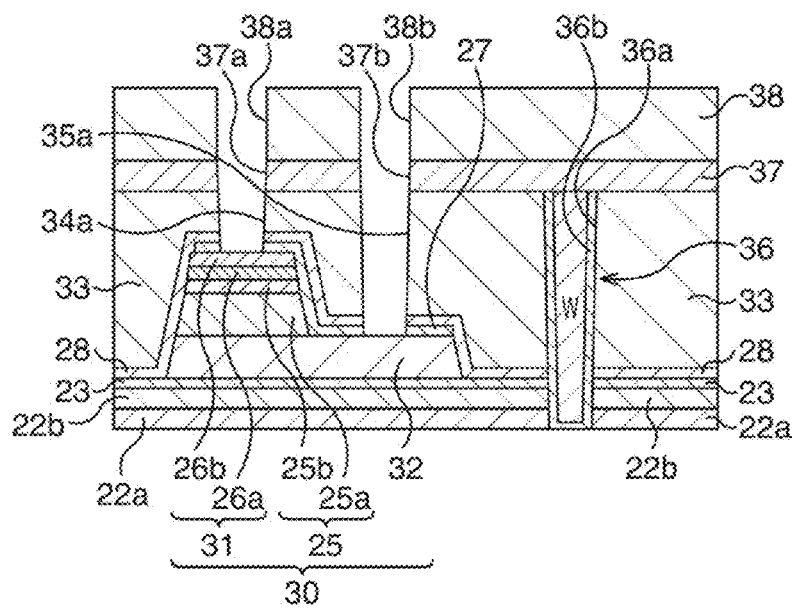
FIG. 4A is a schematic cross-sectional view showing the structure of the FeRAM according to the first embodiment together with the method of manufacturing the same in order of steps.

Subsequently, as shown in FIG. 4A, after a hard mask 37 and a resist mask 38 are formed, via holes 34a, 35a to the ferroelectric capacitor structure 30 are formed.

Specifically, first, by CVD method, a silicon nitride film is deposited with a film thickness of approximately 100 nm on the interlayer insulating film 33, thereby forming the hard mask 37. Next, a resist is applied on the hard mask 37, and the resist is processed by lithography, thereby forming the resist mask 38 having openings 38a, 38b.

Next, the hard mask 37 is dry etched using the resist mask 38, so as to form openings 37a, 37b in portions matching with the openings 38a, 38b of the hard mask 37.

Then, using the hard mask 37 mainly, the interlayer insulating film 33 and the protective films 28, 27 are dry etched with the upper electrode 31 and the lower electrode 32 being etching stoppers respectively. In this dry etching, the processing performed on the interlayer insulating film 33 and the protective films 28, 27 until a portion of a surface of the upper electrode 31 is exposed, and the processing performed on the interlayer insulating film 33 and the protective films 28, 27 until a portion of a surface of the lower electrode 32 is exposed are executed simultaneously, thereby forming via holes 34a, 35a with a diameter of about 0.5 μm for example simultaneously in their respective portions.

Figure 4B:
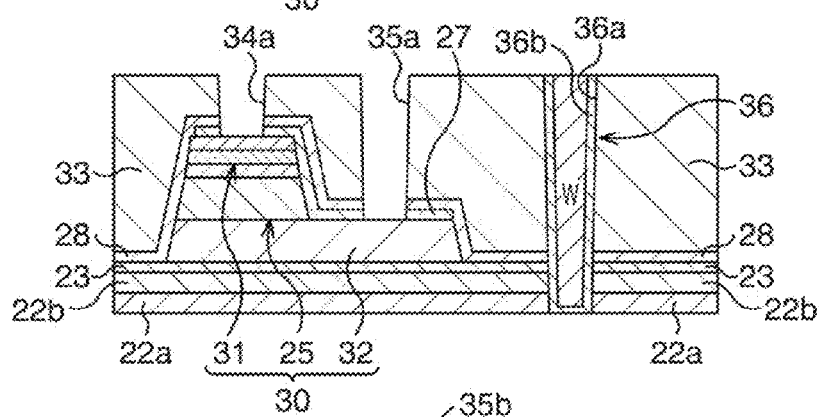
FIG. 4B is a schematic cross-sectional view showing the structure of the FeRAM according to the first embodiment together with the method of manufacturing the same in order of steps.

Subsequently, as shown in FIG. 4B, the resist mask 38 and the hard mask 37 are removed.

Specifically, first, the remained resist mask 38 is removed by ashing or the like. Thereafter, annealing treatment is performed so as to recover the damage received by the ferroelectric capacitor structure 30 through the several steps after the ferroelectric capacitor structure 30 is formed. Then, the hard mask 37 is removed by overall anisotropic etching, so-called etching back.

Figure 4C:
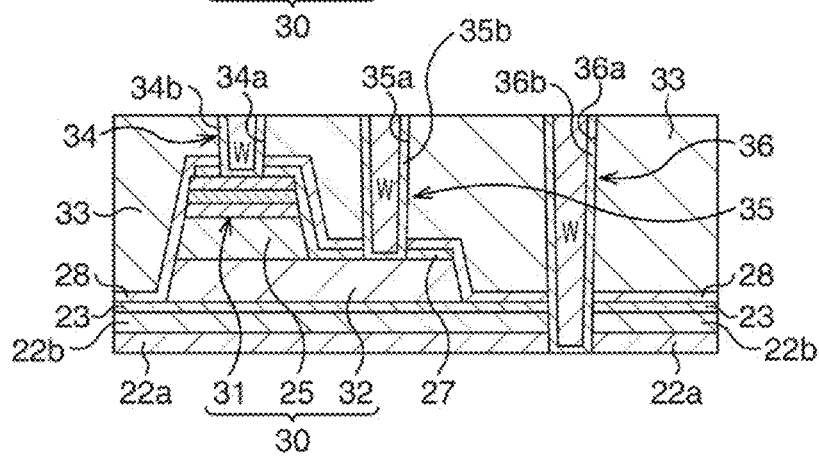
FIG. 4C is a schematic cross-sectional view showing the structure of the FeRAM according to the first embodiment together with the method of manufacturing the same in order of steps.

Subsequently, as shown in FIG. 4C, plugs 34, 35 connected to the ferroelectric capacitor structure 30 are formed.

Specifically, first, after forming base films (glue films) 34b, 35b so as to cover wall surfaces of the via holes 34a, 35a, W films are formed so as to fill the via holes 34a, 35a via the glue films 34b, 35b by CVD method. Then, for example the W films and the glue films 34b, 35b are polished by CMP with the interlayer insulating film 33 being a stopper, thereby forming the plugs 34, 35 filling the via holes 34a, 35a with W via the glue films 34b, 35b. After the CMP, plasma annealing treatment of $N_2O$ for example is performed thereon.

Figure 5A:
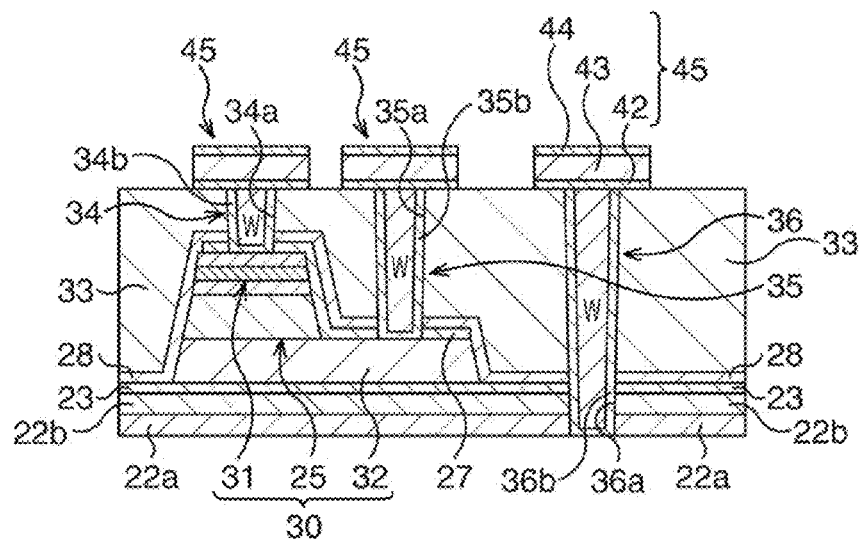
FIG. 5A is a schematic cross-sectional view showing the structure of the FeRAM according to the first embodiment together with the method of manufacturing the same in order of steps.

Subsequently, as shown in FIG. 5A, first wirings 45 connected respectively to the plugs 34, 35, 36 are formed.

Specifically, first, a barrier metal film 42, a wiring film 43 and a barrier metal film 44 are deposited by sputtering method or the like on the entire surface of the interlayer insulating film 33. As the barrier metal film 42, for example, a Ti film with a film thickness of approximately 5 nm and a TiN film with a film thickness of approximatley 150 nm are formed and stacked by sputtering method. As the wiring film 43, for example an Al alloy film (here Al—Cu film) is formed with a film thickness of approximatley 350 nm. As the barrier metal film 44, for example a Ti film with a film thickness of approximatley 5 nm and a TiN film with a film thickness of approximately 150 nm are formed and stacked by sputtering method. Here, the structure of the wiring film 43 is identical to the structure of the logic part other than the FeRAM with the same rule, and hence there is no problem in processing and/or reliability of the wirings.

Next, after an SiON film or an antireflection film (not shown) for example is formed as an antireflection film, the antireflection film, the barrier metal film 44, the wiring film 43 and the barrier metal film 42 are processed in a wiring shape by lithography and subsequent dry etching, thereby pattern forming the first wirings 45 connected to the plugs 34, 35, 36 respectively. In addition, instead of forming the Al alloy film as the wiring film 43, a Cu film (or Cu alloy film) may be formed using so-called damascene method or the like, and then Cu wirings may be formed as the first wirings 45.

Figure 5B:
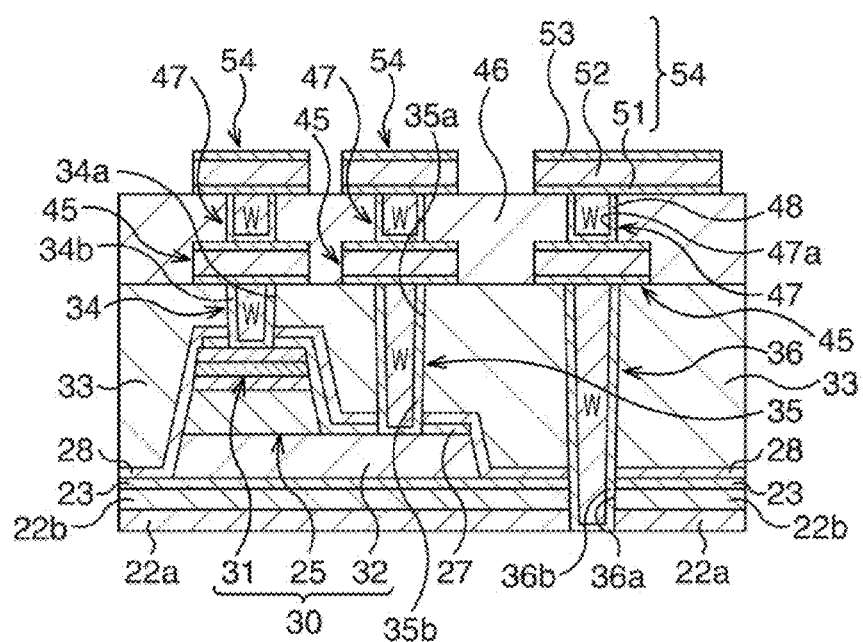
FIG. 5B is a schematic cross-sectional view showing the structure of the FeRAM according to the first embodiment together with the method of manufacturing the same in order of steps.

Subsequently, as shown in FIG. 5B, second wirings 54 connected to the first wirings 45 are formed.

Specifically, first, an interlayer insulating film 46 is formed so as to cover the first wirings 45. As the interlayer insulating film 46, a silicon oxide film is formed with a film thickness of approximately 700 nm, and a plasma TEOS film is formed, thereby making a film thickness of approximately 1100 nm in total. Thereafter, a surface thereof is polished by CMP to form the film thickness of approximately 750 nm.

Next, plugs 47 connected to the first wirings 46 are formed.

First, until portions of surfaces of the first wirings 46 are exposed, the interlayer insulating film 46 is processed by lithography and subsequent dry etching, thereby forming via holes 47a with a diameter of about 0.25 μm for example.

Next, base films (glue films) 48 are formed so as to cover wall surfaces of these via holes 47a, and thereafter W films are formed so as to fill the via holes 47a via the glue films 48 by CVD method. Then, for example the W films and the glue films 48 are polished with the interlayer insulating film 46 being a stopper, thereby forming the plugs 47 filling the via holes 47a with W via the glue films 48.

Next, the second wirings 54 connected respectively to the plugs 47 are formed.

First, a barrier metal film 51, a wiring film 52 and a barrier metal film 53 are deposited on the entire surface by sputtering method or the like. As the barrier metal film 51, for example, a Ti film with a film thickness of approximately 5 nm and a TiN film with a film thickness of approximately 150 nm are formed and stacked by sputtering method. As the wiring film 52, for example an Al alloy film (here Al—Cu film) is formed with a film thickness of approximately 350 nm. As the barrier metal film 53, for example a Ti film with a film thickness of approximately 5 nm and a TiN film with a film thickness of approximately 150 nm are formed and stacked by sputtering method. Here, the structure of the wiring film 52 is identical to the structure of the logic part other than the FeRAM with the same rule, and hence there is no problem in processing and/or reliability of the wirings.

Next, after an SiON film or an antireflection film (not shown) for example is formed as an antireflection film, the antireflection film, the barrier metal film 53, the wiring film 52 and the barrier metal film 51 are processed in a wiring shape by lithography and subsequent dry etching, thereby pattern forming the second wirings 54. In addition, instead of forming the Al alloy film as the wiring film 52, a Cu film (or Cu alloy film) may be formed using so-called damascene method or the like, and then Cu wirings may be formed as the second wirings 54.

Thereafter, several steps of forming an interlayer insulating film, further upper layer wirings, and so on are performed, and thereby the planar-type FeRAM according to this embodiment is completed.

As explained above, according to this embodiment, it is possible to realize a highly reliable planar-type FeRAM in which the inversion charge amount in the ferroelectric capacitor structure 30 is improved without increasing the leak current pointlessly, and thereby a high yield can be assured.

Second Embodiment

In this embodiment, a so-called stack-type FeRAM will be exemplified, in which conduction of a lower electrode of a ferroelectric capacitor structure is realized on a lower side of the ferroelectric capacitor structure, and conduction of an upper electrode is realized on an upper side of the ferroelectric capacitor structure. Note that for the convenience of explanation, the structure of the FeRAM and a method of manufacturing the same will be explained together.

FIG. 7A to FIG. 11B are schematic cross-sectional views showing the structure of the FeRAM according to the second embodiment together with the method of manufacturing the same in order of steps.

Figure 7A:
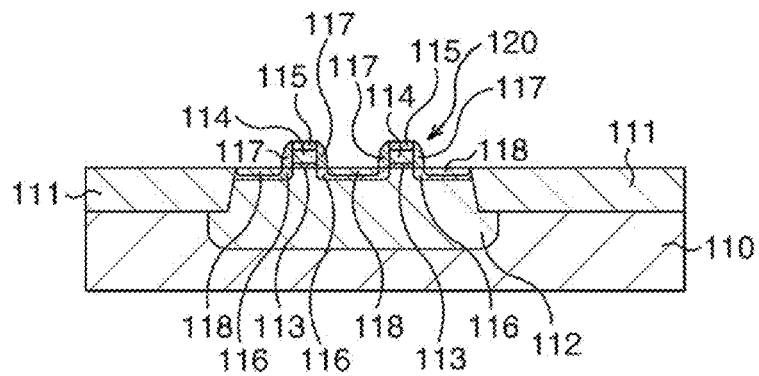
FIG. 7A is a schematic cross-sectional view showing the structure of an FeRAM according to a second embodiment together with a method of manufacturing the same in order of steps.

First, as shown in FIG. 7A, a MOS transistor 120 which functions as a selection transistor is formed on a silicon semiconductor substrate 110.

Specifically, an element isolation structure 111 is formed on a surface layer of the silicon semiconductor substrate 110 for example by STI (Shallow Trench Isolation) method, and an element active region is defined.

Next, impurity, here B, is ion implanted into the element active region under the condition of, for example, a dose amount of $3.0 \times 10^{13}/cm^2$ and acceleration energy of 300 keV, so as to form a well 112.

Next, a thin gate insulating film 113 with a film thickness of approximately 3.0 nm is formed by thermal oxidation or the like in the element active region, a polycrystalline silicon film with a film thickness of approximately 180 nm and a silicon nitride film with a thickness of approximately 29 nm for example are deposited by CVD method on the gate insulating film 113. The silicon nitride film, the polycrystalline silicon film, and the gate insulating film 113 are processed in an electrode form by lithography and subsequent dry etching, so as to pattern form gate electrodes 114 on the gate insulating film 113. At this time, simultaneously, cap films 115 constituted of a silicon nitride film are pattern formed on the gate electrodes 114.

Next, with the cap films 115 being a mask, impurity, here As, is ion implanted into the element active region under the condition of, for example, a dose amount of $5.0 \times 10^{14}/cm^2$ and acceleration energy of 10 keV, so as to form so-called LDD regions 116.

Next, a silicon oxide film for example is deposited on the entire surface by CVD method, and so-called etching back is performed on this silicon oxide film, so as to leave the silicon oxide film only on side faces of the gate electrodes 114 and the cap films 115. Thus, side wall insulating films 117 are formed.

Next, with the cap films 115 and the side wall insulating films 117 being a mask, impurity, here P, is ion implanted into the element active region under the condition to make the impurity concentration higher than in the LDD regions 116 so as to form source/drain regions 118 which are overlapped with the LDD regions 116. Thus, the MOS transistor 120 is completed.

Figure 7B:
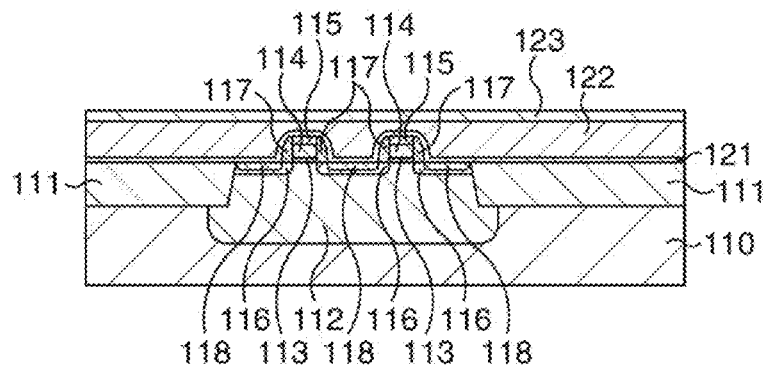
FIG. 7B is a schematic cross-sectional view showing the structure of the FeRAM according to the second embodiment together with the method of manufacturing the same in order of steps.

Subsequently, as shown in FIG. 7B, a protective film 121, an interlayer insulating film 122, and an upper insulating film 123a for the MOS transistor 120 are formed sequentially.

Specifically, the protective film 121, the interlayer insulating film 122, and the upper insulating film 123a are deposited sequentially so as to cover the MOS transistor 120. Here, as the protective film 121, a silicon oxide film is used as a material and is deposited with a film thickness of approximatley 20 nm by CVD method. As the interlayer insulating film 122, for example, there is formed a stacked structure in which a plasma SiO film (approximately 20 nm in film thickness), a plasma SiN film (approximately 80 nm in film thickness) and a plasma TEOS film (approximately 1000 nm in film thickness) are formed sequentially, and after stacking, the structure is polished until the film thickness thereof becomes approximately 700 nm by CMP. As the upper insulating film 123a, a silicon nitride film in used as a material and deposited with a film thickness of approximately 100 nm by CVD method.

Figure 7C:
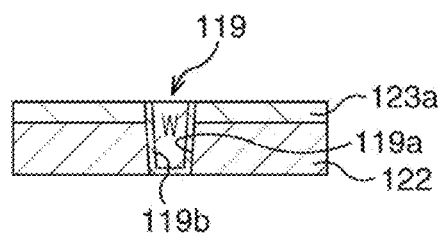
FIG. 7C is a schematic cross-sectional view showing the structure of the FeRAM according to the second embodiment together with the method of manufacturing the same in order of steps.

Subsequently, as shown in FIG. 7C, a plug 119 connected to the source/drain region 118 of the transistor structure 120 is formed. Note that in the views of FIG. 8C and so on, for the convenience of illustration, only the structure above the interlayer insulating film 122 is shown, and the illustration of the silicon semiconductor substrate 110, the MOS transistor 120, and so on is omitted.

Specifically, first, with the source/drain region 118 being an etching stopper, the upper insulating film 123a, the interlayer insulating film 122, and the protective film 121 are processed by lithography and subsequent dry etching until a portion of a surface of the source/drain region 118 is exposed, thereby forming a via hole 119a with a diameter of about 0.3 µm for example.

Next, a Ti film and a TiN film for example are deposited sequentially by sputtering method so as to cover a wall surface of the via hole 119a with a film thickness of approximately 20 nm and a film thickness of approximately 50 nm, thereby forming a base film (glue film) 119b. Then, a W film is formed for example so as to fill the via hole 119a via the glue film 119b by CVD method. Thereafter, the W film and the glue film 119b are polished by CMP with the upper insulating film 123a being a stopper, thereby forming the plug 119 filling the via hole 119a with W via the glue film 119b. After the CMP, plasma annealing treatment of $N_2O$ for example is performed thereon.

Figure 7D:
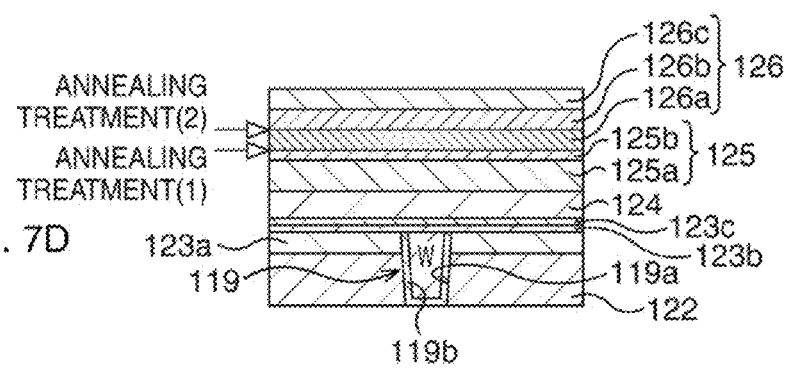
FIG. 7D is a schematic cross-sectional view showing the structure of the FeRAM according to the second embodiment together with the method of manufacturing the same in order of steps.

Subsequently, as shown in FIG. 7D, an orientation property improving film 123b, an oxygen barrier film 123c, a lower electrode layer 124, a ferroelectric film 125, and an upper electrode layer 126 are formed sequentially.

Specifically, first, to improve the orientation property of the ferroelectric capacitor structure, after Ti for example is deposited with a film thickness of approximately 20 nm, Ti is nitrided into TiN in rapid annealing (RTA) treatment at 650° C. in an $N_2$ atmosphere, thereby forming the conductive orientation property improving film 123b.

Concretely, in a sputtering apparatus in which the distance between the semiconductor substrate 110 and the target is set to 60 mm, sputter DC power of 2.6 kW is supplied for seven seconds in an Ar atmosphere of 0.15Pa at a substrate temperature of 20° C., and thereby a Ti film with strong Ti (002) orientation can be obtained. Then thermal treatment is performed on this Ti film by RTA method in a nitrogen atmosphere at 650° C. for 60 seconds, and thereby TiN film with (111) orientation can be obtained.

Next, for example TiAlN is deposited with a film thickness of approximately 100 nm so as to form the conductive oxygen barrier film 123c.

Concretely, by reactive sputtering using a target alloyed with Ti and Al in a mixed atmosphere of Ar at a flow rate of 40 sccm and nitrogen at a flow rate of 10 sccm, TiAlN is formed by sputter power of 1.0 kW with a thickness of 100 nm under pressure of 253.3 Pa and at a substrate temperature of 40° C.

Next, an Ir film is deposited with a film thickness of approximately 100 nm for example by sputtering method, so as to form the lower electrode layer 124.

Concretely, an Ir film is formed by sputter power of 0.5 kW in an Ar atmosphere under pressure of 0.11 Pa and at a substrate temperature of 500° C. Note that as the lower electrode layer 124, metal of the platinum group such as Pt or the like, or a conductive oxide such as PtO, IrOx, SrRuO, may be used instead of the Ir film. Further, it may be a stacked film of the aforementioned metal or a metal oxide.

Next, on the entire surface of the lower electrode layer 124, a first ferroelectric film 125a is formed by MOCVD method for example. The first ferroelectric film 125a is formed using a ferroelectric material having an $ABO_3$-type perovskite structure (A=at least one selected from Bi, Pb, Ba, Sr, Ca, Na, K, and rare-earth elements, and B=at least one selected from Ti, Zr, Nb, Ta, W, Mn, Fe, Co, Cr), for example PZT as a material with a film thickness of approximately 70 nm to 250 nm, here approximately 120 nm. Note that a plurality of A atoms exist in one unit of the perovskite structure, but they are not always the same in each unit. The same also applies to the case of the B atoms.

As a specific example of the MOCVD method, $Pb(DPM)_2$, $Zr(dmhd)_4$, and $Ti(O—iOr)_2(DPM)_2$ are each dissolved in a THF solvent by concentration of 0.3 mol/l, thereby forming respective liquid materials of Pb, Zr, and Ti. Further, these liquid materials are supplied, together with a THF solvent at a flow rate of 0.474 ml/minute, to a carburetor of the MOCVD apparatus at flow rates of 0.326 ml/minute, 0.200 ml/minute, and 0.200 ml/minute respectively and are vaporized, thereby forming source gases of Pb, Zr, and Ti.

Further, they are kept in the MOCVD apparatus under pressure of 665 Pa (5 Torr) at a substrate temperature of 620° C., and the source gases of Pb, Zr, and Ti formed as such are made to operate inside the MOCVD apparatus for 620 seconds. Accordingly, on the lower electrode layer 124, a desired PZT film is formed with a film thickness of approximately 100 nm for example.

In addition, the first ferroelectric film 125a may be formed by sputtering method for example instead of the MOCVD method.

As the material of the first ferroelectric film 125a, it is also possible to use, instead of PZT, one selected from PZT doped with at least one selected from La, Ca, Sr, and Si, PLZT, BLT, SBT, and Bi-layered structure (for example, one selected from $(Bi_{1-x}, R_x) Ti_3O_{12}$ (R is rare-earth element: 0<x<1), $SrBi_2Ta_2O_9$, and $SrBi_4Ti_4O_{15}$). These dielectric materials are the $ABO_3$-type perovskite structure when seen as one unit.

Further, other than the ferroelectric material, a high-dielectric material such as Zr oxide, Pb-based material, or the like may be deposited.

Next, on the entire surface of the first ferroelectric film 125a, a second ferroelectric film 125b in an amorphous state is formed by MOCVD method for example. The second ferroelectric film 125b is formed using a ferroelectric material having an $ABO_3$-type perovskite structure containing Ir elements in at least one of A site and B site (A=at least one selected from Bi, Pb, Ba, Sr, Ca, Na, K, and rare-earth elements, and B=at least one selected from Ti, Zr, Nb, Ta, W, Mn, Fe, Co, Cr), for example PZT as a material with a film thickness of approximately 1 nm to 30 nm, here approximately 20 nm. Note that a plurality of A atoms exist in one unit of the perovskite structure, but they are not always the same in each unit. The same also applies to the case of the B atoms.

As a specific example of the MOCVD method, a material obtained by dissolving $Pb(DPM)_2(Pb(C11H_{19}O_2)_2)$ in a THF (TetraHydroFuran: $C_4H_8O$) liquid is used as an organic source for supplying lead (Pb). Further, a material obtained by dissolving $Zr(DMHD)_4(Zr((C_9H_{15}O_2)_4)$ in a THF liquid is used as an organic source for supplying zirconium (Zr). A material obtained by dissolving $Ti(O—iPr)_2(DPM)_2(Ti (C_3H_7O)_2(C_{12}H_{19}O_2)_2)$ into a THF liquid is used as an organic source for supplying titanium (Ti). A material obtained by dissolving $Ir(DMP)_3(Ir(C_{11}H_{19}O_2)_3)$ in a THF liquid is used as an organic source for supplying iridium (Ir).

The film thickness of the ferroelectric film 125b is desired to be 30 nm or smaller because a switching charge amount in the capacitor structure decreases easily when it is too thick, and here it is set to approximately 20 nm. Further, an Ir element content therein is desired to be approximately 0.01% to 3.00%. When the Ir element content becomes large, Ir elements are accumulated in the grain boundary in the second ferroelectric film 125b during thermal treatment thereafter, and a leak path of the capacitor structure is formed. Here, it is desirable that a raw material containing approximately 1% of Ir is used to form the second ferroelectric film 125b.

In addition, the second ferroelectric film 125b may be formed by sputtering method for example instead of the MOCVD method.

As the material of the second ferroelectric film 125b to which Ir is added, it is also possible to use, instead of PZT, one selected from PZT doped with at least one selected fro La, Ca, Sr, and Si, PLZT, BLT, SBT, and Bi-layered structure (for example, one selected from $(Bi_{1-x}, R_x) Ti_3O_{12}$ (R is rare-earth element: 0<x<1), $SrBi_2Ta_2O_9$, and $SrBi_4Ti_4O_{15}$). These dielectric materials are the $ABO_3$-type perovskite structure when seen as one unit.

Next, the second ferroelectric film 125b is thermally treated. Here, the thermal treatment is performed by RTA (Rapid Thermal Annealing) method in an oxidizing atmosphere, here an atmosphere including oxygen (mixed atmosphere of inert gas and oxygen). For example, the thermal treatment temperature is 550° C. to 800° C., here 580° C. for example, and the thermal treatment time is 30 seconds to 120 seconds, here 60 seconds, in the atmosphere with oxygen at a flow rate of 50 sccm and Ar at a flow rate of 2000 sccm. The suitable thermal treatment temperature is different depending on the type of a ferroelectric material. For example, it is desired that the thermal treatment temperature for PZT or minutely added PZT is 600° c. or below, 700° C. or below for BLT, and 800° C. or below for SBT.

By this thermal treatment, the second ferroelectric film 125b crystallizes, and Ir in the second ferroelectric film 125b combines with the A site and/or the B site of crystal grains in the first ferroelectric film 125a. Here, the ferroelectric film 125 to be a capacitor film is formed by the first ferroelectric film 125a and the second ferroelectric film 125b.

Next, by sputtering method or MOCVD method for example, an $IrO_x$ film (0<x<2) 126a for example with a film thickness of approximately 10 nm to 100 nm, here approximately 50 nm is formed. In addition, a Pt film may be formed instead of the $IrO_x$ film.

Next, in a state that the $IrO_x$ film 126a is formed, the second ferroelectric film 125b is thermally treated here by RTA (Rapid Thermal Annealing) method in a mixed atmosphere of inert gas and oxygen. For example, it is performed at a thermal treatment temperature of 725° C. for a thermal treatment time of 60 seconds in an atmosphere of oxygen at a flow rate of 20 sccm and Ar at a flow rate of 2000 sccm.

By this thermal treatment, the second ferroelectric film 125b crystallizes completely, and plasma damage on the $IrO_x$ film 126a can be recovered, thereby compensating oxygen deficiency in the second ferroelectric film 125b.

Next, an $IrO_y$ film ($0<y\leqq2$) 126b with a film thickness of approximately 100 nm to 300 nm is deposited on the $IrO_x$ film 126a (it becomes 200 nm when deposited by sputter power of 1.0 kW under pressure of 0.8 Pa for 79 seconds in an Ar atmosphere). At this time, to suppress deterioration of the capacitor structure in several subsequent steps, the composition ratio Y of oxygen in the $IrO_y$ film 126b is made to be higher than the composition ratio X of oxygen in the $IrO_x$ film 126a. By forming the $IrO_y$ film 126b in a composition close to the stoichiometric composition of $IrO_z$, it does not exhibit catalytic effect for hydrogen. Thus, a problem that the ferroelectric film is reduced by hydrogen radicals is suppressed, and hydrogen resistance of the capacitor structure improves. In addition, instead of the $IrO_x$ film 126a and the $IrO_y$ film 126b, it is possible to use Ir, Ru, Rh, Re, Os, Pd, and oxide of one of them, and a conductive oxide such as $SrRuO_3$ or the like, or a stacked structure of them.

Next, on the $IrO_y$ film 126b, an Ir film 126c which functions as a hydrogen barrier film is deposited with a thickness of 100 nm by sputtering method for example in an Ar atmosphere under pressure of 1 Pa and by sputter power of 1.0 kW. At this time, the upper electrode layer 126 constituted by stacking the $IrO_x$ film 126a, $IrO_y$ film 126b, and Ir film 126c is formed. In addition, instead of the Ir film 126c, a Pt film or $SrRuO_3$ film may be formed besides.

Figure 8A:
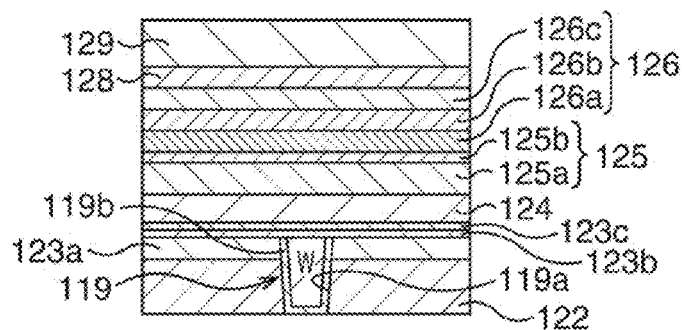
FIG. 8A is a schematic cross-sectional view showing the structure of the FeRAM according to the second embodiment together with the method of manufacturing the same in order of steps.

Subsequently, after back surface cleaning of the semiconductor substrate 110 is performed, as shown in FIG. 8A, a TiN film 128 and a silicon oxide film 129 are formed.

Specifically, the TiN film 128 is deposited and formed by sputtering method or the like with a film thickness of approximately 200 nm on the upper electrode layer 126. The silicon oxide film 129 is deposited and formed with a film thickness of approximately 1000 nm on the TiN film 128 by CVD method using TEOS for example. Here, an HDP film may be formed instead of TEOS. In addition, it is also preferable to further form a silicon nitride film on the silicon oxide film 129.

Figure 8B:
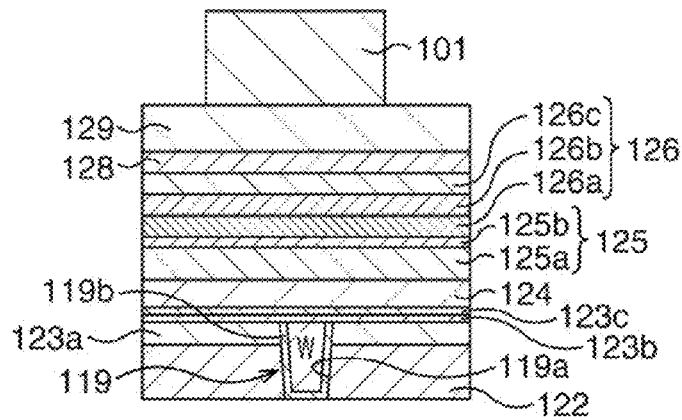
FIG. 8B is a schematic cross-sectional view showing the structure of the FeRAM according to the second embodiment together with the method of manufacturing the same in order of steps.

Subsequently, a resist mask 101 is formed as shown in FIG. 8B.

Specifically, a resist is applied on the silicon oxide film 129, and this resist is processed in an electrode shape by lithography, so as to form the resist mask 101.

Figure 8C:
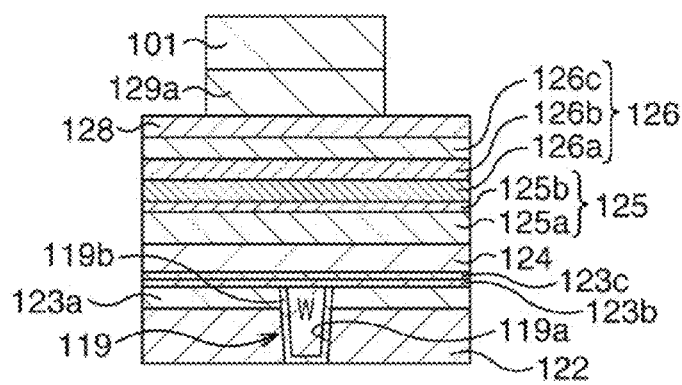
FIG. 8C is a schematic cross-sectional view showing the structure of the FeRAM according to the second embodiment together with the method of manufacturing the same in order of steps.

Subsequently, the silicon oxide film 129 is processed as shown in FIG. 8C.

Specifically, the silicon oxide film 129 is dry etched with the resist mask 101 being a mask. At this time, the silicon oxide film 129 is patterned by copying the electrode shape of the resist mask 101, and thereby a hard mask 129a is formed. Further, the resist mask 101 is also reduced in thickness by begin etched.

Figure 8D:
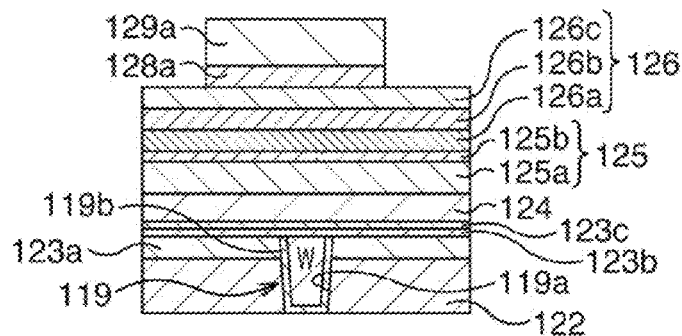
FIG. 8D is a schematic cross-sectional view showing the structure of the FeRAM according to the second embodiment together with the method of manufacturing the same in order of steps.

Subsequently, the TiN film 128 is processed as shown in FIG. 8D.

Specifically, the TiN film 128 is dry etched with the resist mask 101 and the hard mask 129a being a mask. At this time, the TiN film 128 is patterned by copying the electrode shape of the hard mask 129a, and thereby a hard mask 128a is formed. Further, the resist mask 101 is etched itself and becomes thin during the etching. Thereafter, the resist mask 101 is removed by ashing or the like.

Figure 9A:
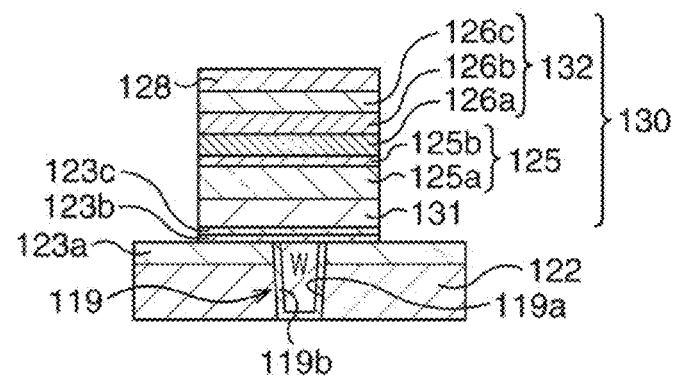
FIG. 9A is a schematic cross-sectional view showing the structure of the FeRAM according to the second embodiment together with the method of manufacturing the same in order of steps.

Subsequently, as shown in FIG. 9A, the upper electrode layer 126, the capacitor film 125, the lower electrode layer 124, the oxygen barrier film 123c, and the orientation property improving film 123b are processed.

Specifically, with the hard masks 128a, 129a being a mask and the upper insulating film 123 being an etching stopper, the upper electrode layer 126, the capacitor film 125, the lower electrode layer 124, the oxygen barrier film 123c, and the orientation property improving film 123b are dry etched. At this time, the upper electrode layer 126, the capacitor film 125, the lower electrode layer 124, the oxygen barrier film 123c, and the orientation property improving film 123b are patterned by coping the electrode shape of the hard mask 128a. Further, the hard mask 129a is etched itself and becomes thin during the etching. Thereafter, the hard mask 129a is etch removed by dry etching (etch back) on the entire surface.

Figure 9B:
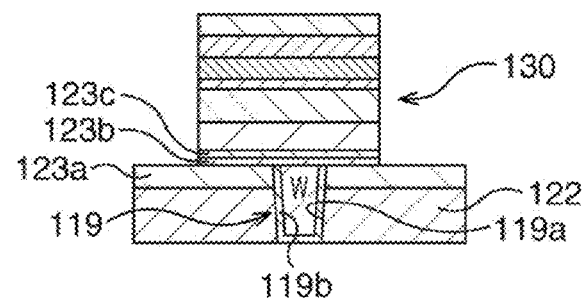
FIG. 9B is a schematic cross-sectional view showing the structure of the FeRAM according to the second embodiment together with the method of manufacturing the same in order of steps.

Subsequently, as shown in FIG. 9B, a ferroelectric capacitor structure 130 is completed as shown in FIG. 9B.

Specifically, the hard mask 128a used as a mask is removed by wet etching. At this time, a capacitor film 125 and the upper electrode 132 are stacked sequentially on and above the lower electrode 131, and thereby the ferroelectric capacitor structure 130 in which the lower electrode 131 and the upper electrode 132 are capacitively coupled via the capacitor film 125 is completed. In this ferroelectric capacitor structure 130, the lower electrode 131 is connected to the plug 119 via the orientation property improving film 123b and the oxygen barrier film 123c which are conductive, and the source/drain 118 and the lower electrode 131 are connected electrically via the plug 119, the orientation property improving film 123b, and the oxygen barrier film 123c.

In the ferroelectric capacitor structure 130 according to this embodiment, the ferroelectric film 125 contains iridium inside, and has an iridium concentration distribution such that the iridium concentration gets lower with distance from an upper layer region toward a lower layer region.

Figure 12:
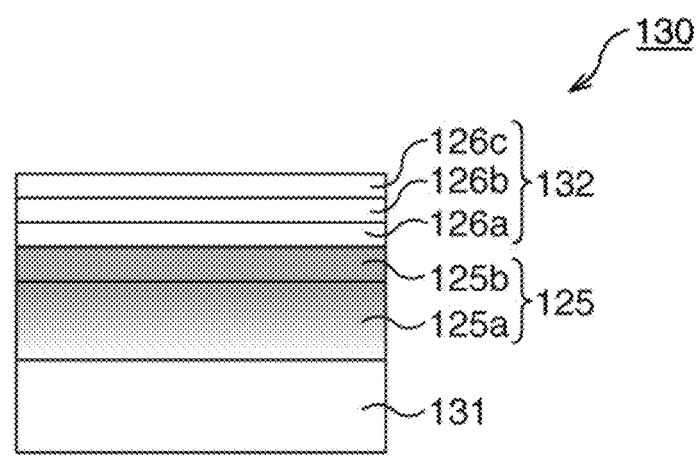
FIG. 12 is a schematic cross-section view showing a capacitor structure of the FeRAM according to the second embodiment.

Specifically, as shown in FIG. 12, there is formed an iridium concentration distribution such that the iridium concentration is even and high in an upper layer region of the ferroelectric film 125, namely the portion of the second ferroelectric film 125b, and the iridium concentration decreases in a downward direction in a lower layer region of the ferroelectric film 125, namely the portion of the first ferroelectric film 125a.

Figure 9C:
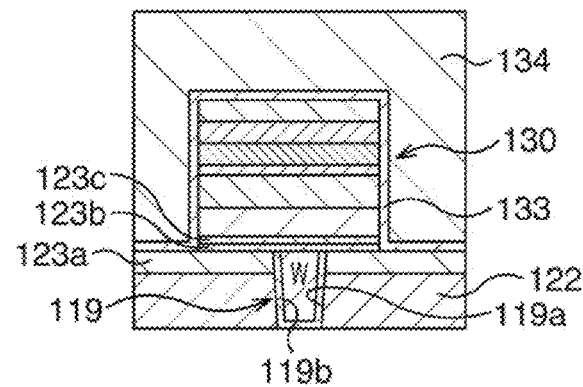
FIG. 9C is a schematic cross-sectional view showing the structure of the FeRAM according to the second embodiment together with the method of manufacturing the same in order of steps.

Subsequently, as shown in FIG. 9C, a protective film 133 and the interlayer insulating film 134 are formed.

Specifically, first, alumina ($Al_2O_3$) is used as a material and deposited with a film thickness of approximately 20 nm to 50 nm so as to cover the entire surface of the ferroelectric capacitor structure 130 by sputtering method, thereby forming the protective film 133. Thereafter, the protective film 133 is anneal treated.

Next, an interlayer insulating film 234 is formed so as to cover the ferroelectric capacitor structure 130 via the protective film 133. Here, as the interlayer insulating film 134, a silicon oxide film is deposited with a film thickness of approximately 1500 nm to 2500 nm by plasma CVD method using TEOS for example, and thereafter it is formed by polishing until the film thickness thereof becomes approximately 1000 nm by CMP for example. After the CMP, for the purpose of dehydrating the interlayer insulating film 134, plasma annealing treatment of N$_2$O for example is performed thereon.

Figure 10A:
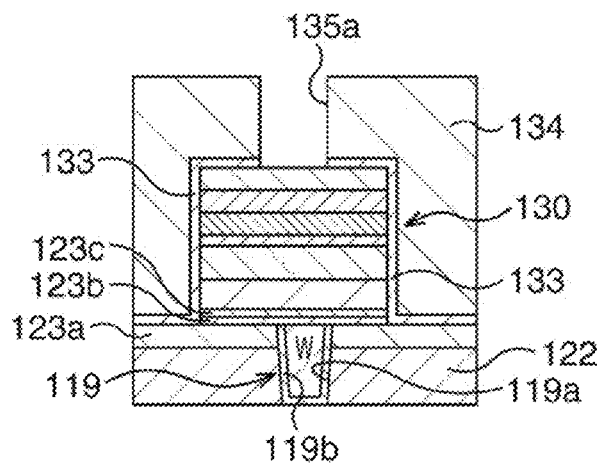
FIG. 10A is a schematic cross-sectional view showing the structure of the FeRAM according to the second embodiment together with the method of manufacturing the same in order of steps.

Subsequently, as shown in FIG. 10A, a via hole 135a is the upper electrode 132 of the ferroelectric capacitor structure 130 is formed.

Specifically, the interlayer insulating film 134 and the protective film 133 are patterned by lithography and subsequent dry etching, to thereby form the via hole 135a which exposes a portion of a surface of the upper electrode 132.

Figure 10B:
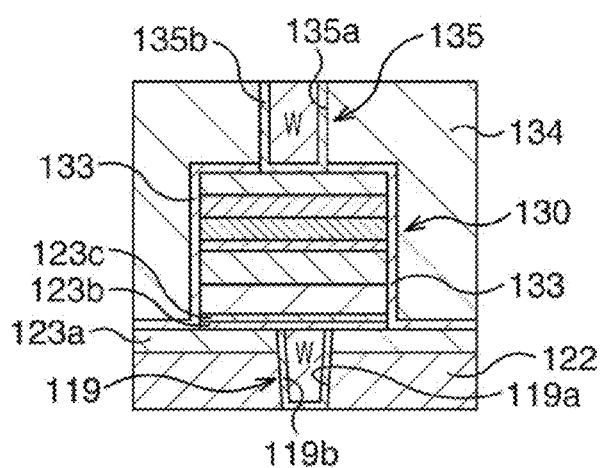
FIG. 10B is a schematic cross-sectional view showing the structure of the FeRAM according to the second embodiment together with the method of manufacturing the same in order of steps.

Subsequently, as shown in FIG. 10B, a plug 135 connected to the upper electrode 132 of the ferroelectric capacitor structure 130 is formed.

Specifically, first, after forming a base film (glue film) 135b so as to cover a wall surface of the via hole 135a, a W film is formed so as to fill the via hole 135a via the glue film 135b by CVD method. Then, for example the W film and the glue film 135b are polished by CMP with the interlayer insulating film 134 being a stopper, thereby forming the plug 135 filling the via hole 135a with W via the glue film 135b. After the CMP, plasma annealing treatment of N$_2$O for example is performed thereon.

Figure 11A:
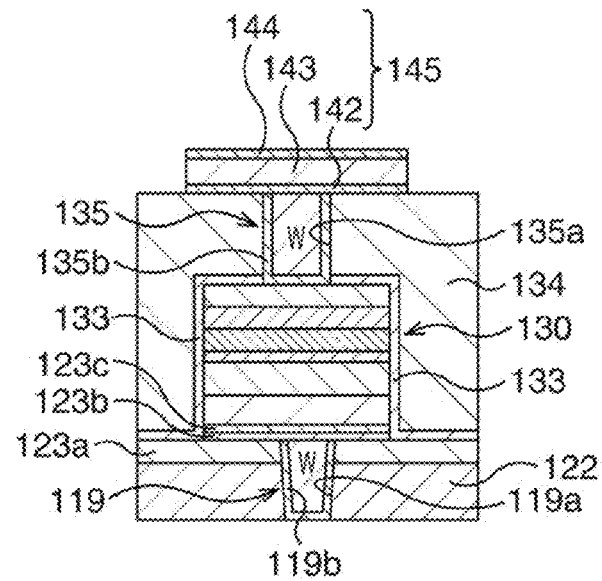
FIG. 11A is a schematic cross-sectional view showing the structure of the FeRAM according to the second embodiment together with the method of manufacturing the same in order of steps.

Subsequently, as shown in FIG. 11A, a first wiring 145 connected to the plug 135 is formed.

Specifically, first, a barrier metal film 142, a wiring film 143 and a barrier metal film 144 are deposited by sputtering method or the like on the entire surface of the interlayer insulating film 134. As the barrier metal film 142, for example, a Ti film with a film thickness of approximatley 5 nm and a TiN film with a film thickness of approximately 150 nm are formed and stacked by sputtering method. As the wiring film 143, for example an Al alloy film (here Al—Cu film) is formed with a film thickness of approximately 350 nm. As the barrier metal film 144, for example a Ti film with a film thickness of approximately 5 nm and a TiN film with a film thickness of approximately 150 nm are formed and stacked by sputtering method. Here, the structure of the wiring film 143 is identical to the structure of the logic part other than the FeRAM with the same rule, and hence there is no problem in processing and/or reliability of the wirings.

Next, after an SiON film or an antireflection film (not shown) for example is formed as an antireflection film, the antireflection film, the barrier metal film 144, the wiring film 143 and the barrier metal film 142 are processed in a wiring shape by lithography and subsequent dry etching, thereby pattern forming the first wiring 145 connected to the plug 135. In addition, instead of forming the Al alloy film as the wiring film 143, a Cu film (or Cu film alloy film) may be formed using so-called damascene method or the like, and then Cu wirings may be formed as the first wiring 145.

Figure 11B:
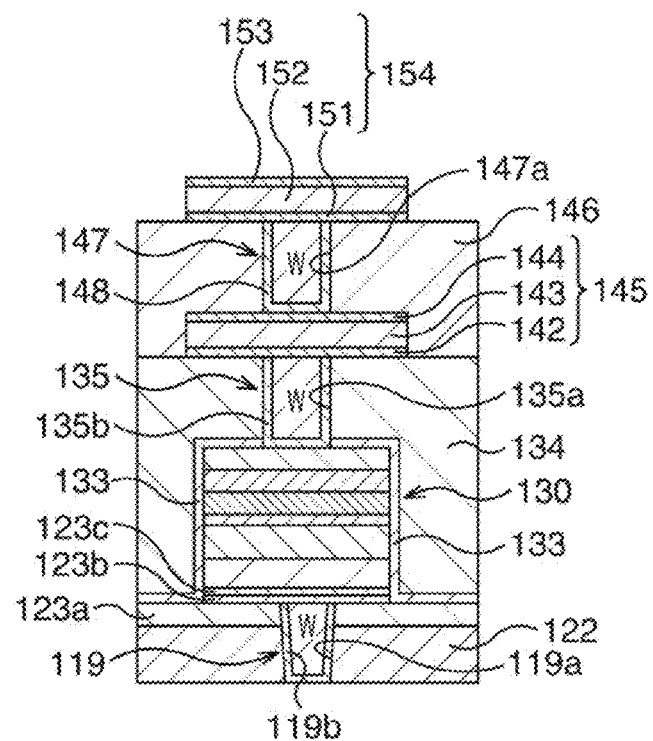
FIG. 11B is a schematic cross-sectional view showing the structure of the FeRAM according to the second embodiment together with the method of manufacturing the same in order of steps.

Subsequently, as shown in FIG. 11B, a second wiring 154 connected to the first wiring 145 is formed.

Specifically, first, an interlayer insulating film 146 is formed so as to cover the first wiring 145. As the interlayer insulating film 146, a silicon oxide film is formed with a film thickness of approximately 700 nm, and a plasma TEOS film is formed, thereby making a film thickness of approximately 1100 nm in total. Thereafter, a surface thereof is polished by CMP to form the film thickness of approximately 750 nm.

Next, a plugs 147 connected to the first wiring 145 is formed.

Until a portion of a surface of the first wiring 145 is exposed, the interlayer insulating film 146 is processed by lithography and subsequent dry etching, thereby forming via holes 147a with a diameter of about 0.25 µm for example. Next, a base film (glue film) 148 is formed so as to cover a wall surface of this via hole 147a, and thereafter a W film is formed so as to fill the via hole 147a via the glue film 148 by CVD method. Then, for example the W film and the glue film 148 are polished with the interlayer insulating film 146 being a stopper, thereby forming the plug 147 filling the via hole 147a with W via the glue film 148.

Next, a second wiring 154 connected to the plug 147 is formed.

First, a barrier metal film 151, a wiring film 152 and a barrier metal film 153 are deposited on the entire surface by sputtering method or the like. As the barrier metal film 151, for example, a Ti film with a film thickness of approximately 5 nm and a TiN film with a film thickness of approximately 150 nm are formed and stacked by sputtering method. As the wiring film 152, for example an Al alloy film (here Al—Cu film) is formed with a film thickness of approximately 350 nm. As the barrier metal film 153, for example a Ti film with a film thickness of approximately 5 nm and a TiN film with a film thickness of approximately 150 nm are formed and stacked by sputtering method. Here, the structure of the wiring film 152 is identical to the structure of the logic part other than the FeRAM with the same rule, and hence there is no problem in processing and/or reliability of the wirings.

Next, after a SiON film or an antireflection film (not shown) for example is formed as an antireflection film, the antireflection film, the barrier metal film 153, the wiring film 152 and the barrier metal film 151 are processed in a wiring shape by lithography and subsequent dry etching, thereby pattern forming the second wiring 154. In addition, instead of forming the Al alloy film as the wiring film 152, a Cu film (or Cu alloy film) may be formed using so-called damascene method or the like, and then Cu wiring may be formed as the second wiring 154.

Thereafter, several steps of forming an interlayer insulating film, further upper layer wirings, and so on are performed, and thereby the stack-type FeRAM according to this embodiment is completed.

As explained above, according to this embodiment, it is possible to realize a highly reliable stack-type FeRAM in which the inversion charge amount in the ferroelectric capacitor structure 130 is improved without increasing the leak current pointlessly, and thereby a high yield can be assured.

Third Embodiment

In this embodiment, several other examples applicable to the first embodiment will be explained. Here, the explanation will be given based on the first embodiment, but it can be also applied to the second embodiment similarly. Note that in respective views of FIG. 13A to FIG. 13C, FIG. 14A to FIG. 14C, only components corresponding to FIG. 1D are shown.

EXAMPLE 1

Figure 13A:
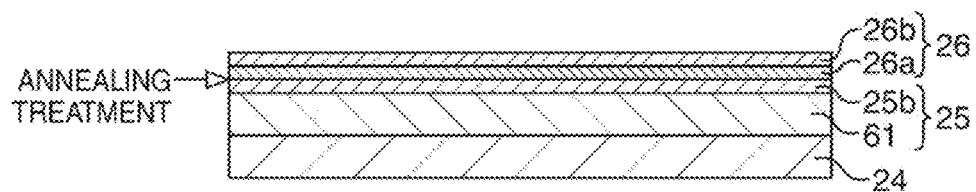
FIG. 13A is a schematic cross-sectional view showing only components corresponding to FIG. 1D as main components of example 1 according to a third embodiment.

FIG. 13A is a schematic cross-sectional view showing only components corresponding to FIG. 1D as main components of example 1.

In this example, first, on the lower electrode layer 24 in the first embodiment, a first ferroelectric film is formed by sputtering method at a low temperature, for example 10° C. to 100° C., here 50° C., and thereby a first ferroelectric film 61 in an amorphous state is formed. A film thickness and so on thereof are the same as in the first ferroelectric film 25a.

Subsequently, similarly to the first embodiment, a target to which Ir is added is used to form a second ferroelectric film 25b by sputtering method.

Thereafter, the first ferroelectric film 61 and the second ferroelectric film 25b are crystallized by RTA method. In the case where the first ferroelectric film 61 and the second ferroelectric film 25b are PZT films, when the total film thickness of the PZT films is approximately 150 nm, thermal treatment is performed at 560° C. to 580° C. for 90 seconds in a mixed atmosphere of Ar at a flow rate of 2 slm and $O_2$ at a flow rate of 25 sccm. Further, in addition to this thermal treatment, it is desirable to perform thermal treatment at 700° c. to 750° c. for 60 seconds in an atmosphere of oxygen.

By this thermal treatment, the first ferroelectric film 61 and the second ferroelectric film 25b crystallize completely, and Ir in the second ferroelectric film 25b combines with the A site and/or the B site of crystal grains in the first ferroelectric film 61. Here, the ferroelectric film 25 to be a capacitor film is formed by the first ferroelectric film 61 and the second ferroelectric film 25b.

Thereafter, similarly to the first embodiment, the upper electrode layer 24 is formed and patterned, to thereby form a ferroelectric capacitor structure 30.

EXAMPLE 2

Figure 13B:
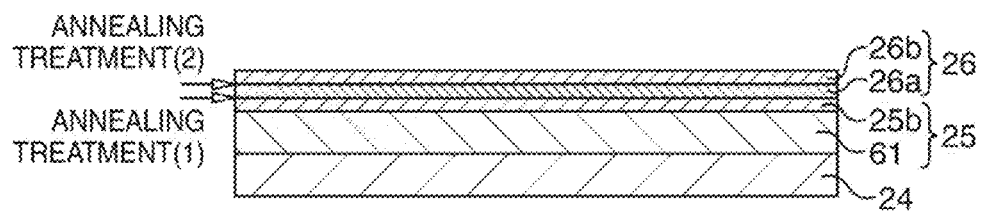
FIG. 13B is a schematic cross-sectional view showing only components corresponding to FIG. 1D as main components of example 2 according to the third embodiment.

FIG. 13B is a schematic cross-sectional view showing only components corresponding to FIG. 1D as main components of example 2.

In this example, first, similarly to example 1, the first ferroelectric film 61 in an amorphous state is formed as the first ferroelectric film on the lower electrode layer 24. A film thickness and so on thereof are the same as in the first ferroelectric film 25a. Thereafter, the first ferroelectric film 61 is crystallized by RTA method. In the case where the first ferroelectric film 61 is a PZT film, thermal treatment is performed at 560° C. to 580° C. for 90 seconds in a mixed atmosphere of Ar at a flow rate of 2 slm and $O_2$ at a flow rate of 25 sccm.

Subsequently, similarly to the first embodiment, a target to which Ir is added is used to form a second ferroelectric film 25b by sputtering method.

Thereafter, the first ferroelectric film 61 and the second ferroelectric film 25b are crystallized by RTA method. In the case where the first ferroelectric film 61 and the second ferroelectric film 25b are PZT films, when the total thickness of the PZT films is approximately 150 nm, thermal treatment is performed at 560° C. to 580° C. for 90 seconds in a mixed atmosphere of Ar at a flow rate of 2 slm and $O_2$ at a flow rate of 25 sccm. Further, in addition to this thermal treatment, it is desirable to perform thermal treatment at 700° C. to 750° C. for 60 seconds in an atmosphere of oxygen.

By this thermal treatment, the second ferroelectric film 25b crystallizes completely, and Ir in the second ferroelectric film 25b combines with the A site and/or the B site of crystal grains in the first ferroelectric film 61. Here, the ferroelectric film 25 to be a capacitor film is formed by the first ferroelectric film 61 and the second ferroelectric film 25b.

Thereafter, similarly to the first embodiment, the upper electrode layer 26 is formed and patterned, to thereby form a ferroelectric capacitor structure 30.

Here, using abnormal dispersion method, it was confirmed that Ir is doped in crystal lattices of PZT. The abnormal dispersion is a phenomenon in which a refractive index and/or scattering power change largely due to resonance effect in a state that the oscillation frequency of an X-ray is close to the vibration frequency of the absorption edge of an atom. In other words, while measuring X-ray diffraction intensity of a certain substance, when the substance is irradiated with energy close to the absorption edge of the constituent element of the substance, the X-ray diffraction intensity changes largely. By examining energy dependence of diffraction intensity of a certain peak using this phenomenon, the constituent element of this peak can be clarified.

To examine doping of Ir into the PZT film, energy in the vicinity of the LIII absorption edge of Ir is used. Note that the LIII is the electron orbit in an Ir atom.

Figure 15:
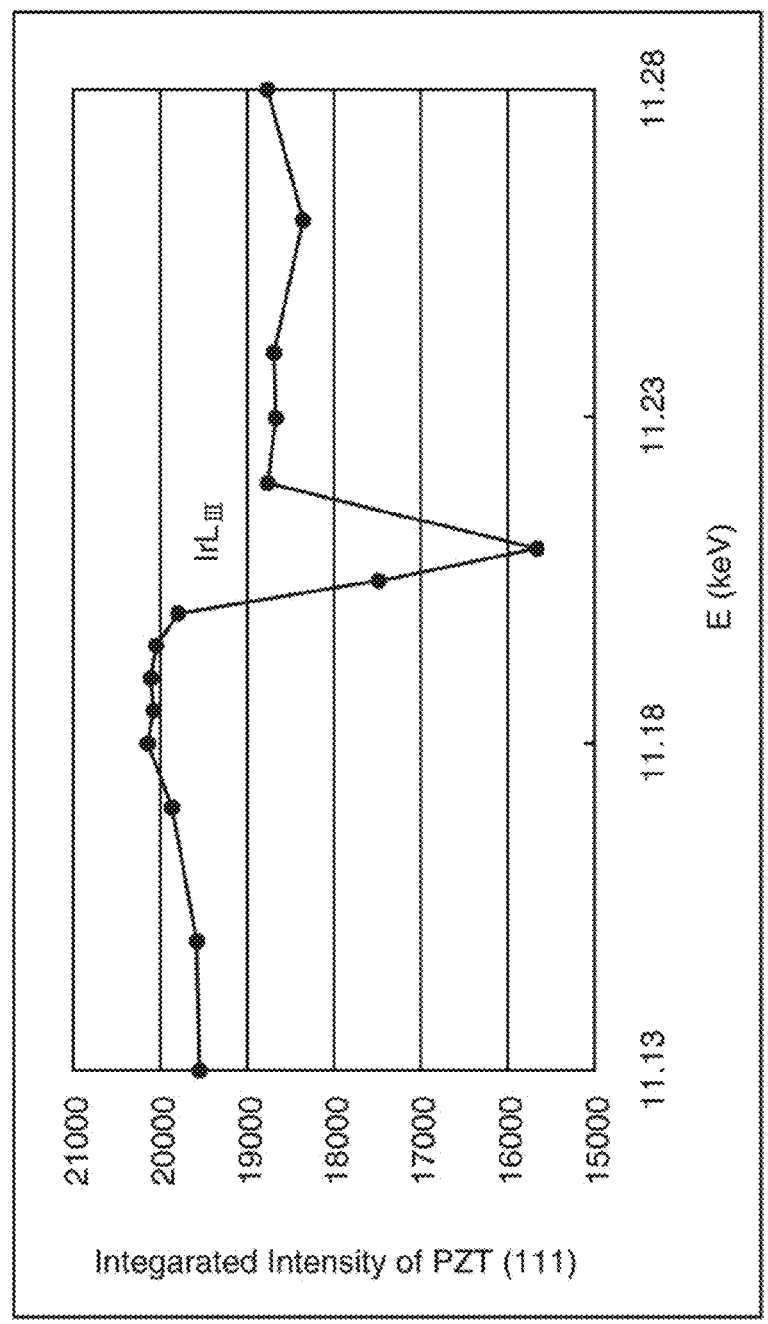
FIG. 15 is a characteristic chart showing results of examining X-ray incident energy dependence of a peak of PZT (111) orientation intensity.

FIG. 15 shows results of examining X-ray incident energy dependence of a peak of PZT (111) orientation intensity after the PZT formed and stacked on a lower electrode layer constituted of Pt is anneal treated.

As the X-ray, a wavelength in the vicinity of the LIII absorption edge of Ir is used. The decrease of the intensity becomes large when the energy at the LIII absorption edge of Ir is 11.21 eV. This clearly indicates that Ir is included in the crystal lattice of the PZT doped with Ir. It can be seen that in the PZT doped with Ir, Ir is not simply diffused in the PZT film but Ir is included as crystal constituent elements for the PZT. In other words, the PZT has a crystal structure containing Ir elements in at least one of A site and B site of its $ABO_3$-type perovskite structure.

EXAMPLE 3

Figure 13C:
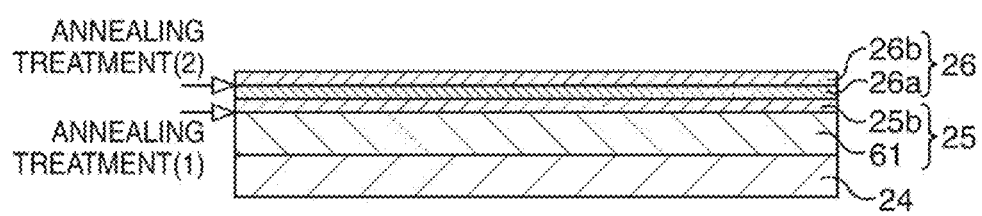
FIG. 13C is a schematic cross-sectional view showing only components corresponding to FIG. 1D as main components of example 3 according to the third embodiment.

FIG. 13C is a schematic cross-sectional view showing only components corresponding to FIG. 1D as a main structure of example 3.

In this example, first, similarly to example 1, the first ferroelectric film 61 in an amorphous state is formed as the first ferroelectric film on the lower electrode layer 24. A film thickness and so on thereof are the same as in the first ferroelectric film 25a. Thereafter, the first ferroelectric film 61 is crystallized by RTA method. In the case where the first ferroelectric film 61 is a PZT film, thermal treatment is performed at 560° C. to 580° C. for 90 seconds in a mixed atmosphere of Ar at a flow rate of 2 slm and $O_2$ at a flow rate of 25 sccm.

Subsequently, similarly to the first embodiment, a target to which Ir is added is used to form a second ferroelectric film 25b by sputtering method.

Subsequently, similarly to the first embodiment, an $IrO_x$ film (0<x<2) 26a with a film thickness of approximately 50 nm is formed. In addition, a Pt film may be formed instead of the $IrO_x$ film.

Thereafter, the second ferroelectric film 25b is crystallized by RTA method. When the second ferroelectric film 25b is a PZT film, it is performed at a thermal treatment temperature of 725° C. for a thermal treatment time of 60 seconds in a mixed atmosphere of oxygen at a flow rate of 20 sccm and Ar at a flow rate of 2000 sccm.

By this thermal treatment, the second ferroelectric film 25b crystallizes completely, and Ir in the second ferroelectric film 25b combines with the A site and/or the B site of crystal grains in the first ferroelectric film 61. Further, plasma damage on the $IrO_x$ film 26a can be recovered, and oxygen deficiency in the second ferroelectric film 25b is compensated. Here, the ferroelectric film 25 to be a capacitor film is formed by the first ferroelectric film 61 and the second ferroelectric film 25b.

Thereafter, similarly to the first embodiment, the $IrO_y$ film 26b is formed and patterned, to thereby form a ferroelectric capacitor structure 30.

EXAMPLE 4

Figure 14A:
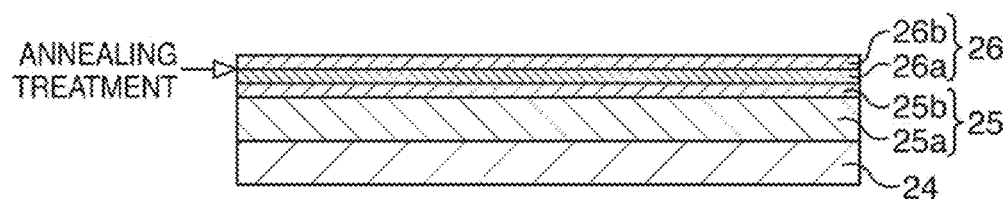
FIG. 14A is a schematic cross-sectional view showing only components corresponding to FIG. 1D as main components of example 4 according to the third embodiment.

FIG. 14A is a schematic cross-sectional view showing only components corresponding to FIG. 1D as main components of example 4.

In this example, first, similarly to the first embodiment, the first ferroelectric film 25a is formed as the first ferroelectric film on the lower electrode layer 24.

Subsequently, similarly to the first embodiment, a target to which Ir is added is used to form a second ferroelectric film 25b by sputtering method.

Subsequently, similarly to the first embodiment, an $IrO_x$ film (0<x<2) 26a with a film thickness of approximately 50 nm is formed. In addition, a Pt film may be formed instead of the $IrO_x$ film.

Thereafter, the second ferroelectric film 25b is crystallized by RTA method. When the second ferroelectric film 25b is a PZT film, it is performed at a thermal treatment temperature of 725° C. for a thermal treatment time of 60 seconds in an atmosphere of oxygen at a flow rate of 20 sccm and Ar at a flow rate of 2000 sccm.

By this thermal treatment, the second ferroelectric film 25b crystallizes completely, and Ir in the second ferroelectric film 25b combines with the A site and/or the B site of crystal grains in the first ferroelectric film 25a. Further, plasma damage on the $IrO_x$ film 26a can be recovered, and oxygen deficiency in the second ferroelectric film 25b is compensated. Here, the ferroelectric film 25 to be a capacitor film is formed by the first ferroelectric film 25a and the second ferroelectric film 25b.

Thereafter, similarly to the first embodiment, the $IrO_y$ film 26b is formed and patterned, to thereby form a ferroelectric capacitor structure 30.

EXAMPLE 5

Figure 14B:
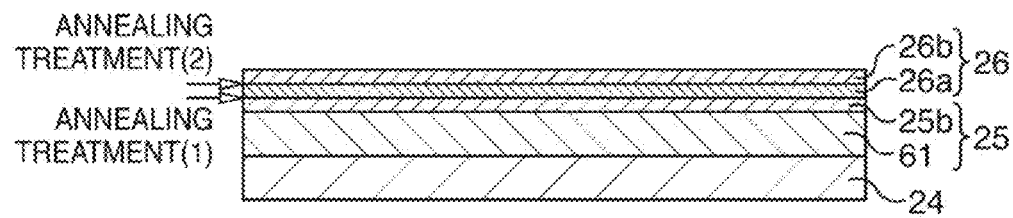
FIG. 14B is a schematic cross-sectional view showing only components corresponding to FIG. 1D as main components of example 5 according to the third embodiment.

FIG. 14B is a schematic cross-sectional view showing only components corresponding to FIG. 1D as a main structure of example 5.

In this example, first, similarly to example 1, the first ferroelectric film 61 in an amorphous state is formed on the lower electrode layer 24. A film thickness and so on thereof are the same as in the first ferroelectric film 25a. Note that the first ferroelectric film 25a may be formed similarly to the first embodiment.

Subsequently, similarly to the first embodiment, a target to which Ir is added is used to form a second ferroelectric film 25b by sputtering method.

Thereafter, the first ferroelectric film 61 and the second ferroelectric film 25b are crystallized by RTA method. In the case where the first ferroelectric film 61 and the second ferroelectric film 25b are PZT films, when the total thickness of the PZT film is approximately 150 nm, thermal treatment is performed at 560° C. to 580° C. for 90 seconds in a mixed atmosphere of Ar at a flow rate of 2 slm and $O_2$ at a flow rate of 25 sccm.

By this thermal treatment, the first ferroelectric film 61 and the second ferroelectric film 25b crystallize completely, and Ir in the second ferroelectric film 25b combines with the A site and/or the B site of crystal grains in the first ferroelectric film 61. Here, the ferroelectric film 25 to be a capacitor film is formed by the first ferroelectric film 61 and the second ferroelectric film 25b.

Subsequently, similarly to the first embodiment, an $IrO_x$ film (0<x<2) 26a with a film thickness of approximately 50 nm is formed. In addition, a Pt film may be formed instead of the $IrO_x$ film.

Thereafter, RTA method is performed. When the second ferroelectric film 25b is a PZT film, it is performed at a thermal treatment temperature of 725° C. for a thermal treatment time of 120 seconds in an atmosphere of oxygen at a flow rate of 20 sccm and Ar at a flow rate of 2000 sccm.

By this thermal treatment, the second ferroelectric film 25b crystallized completely, and Ir in the second ferroelectric film 25b combines with the A site and/or the B site of crystal grains in the first ferroelectric film 61. Further, plasma damage on the $IrO_x$ film 26a can be recovered, and oxygen deficiency in the second ferroelectric film 25b is compensated. Here, the ferroelectric film 25 to be a capacitor film is formed by the first ferroelectric film 61 and the second ferroelectric film 25b.

Thereafter, similarly to the first embodiment, the $IrO_x$ film 26b is formed and patterned, to thereby form a ferroelectric capacitor structure 30.

EXAMPLE 6

Figure 14C:
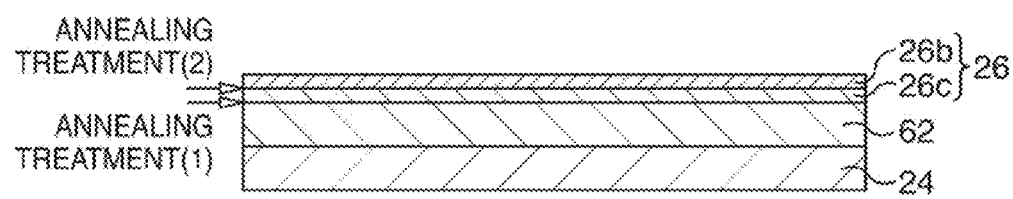
FIG. 14C is a schematic cross-sectional view showing only components corresponding to FIG. 1D as main components of example 6 according to the third embodiment.

FIG. 14C is a schematic cross-sectional view showing only components corresponding to FIG. 1D as main components of example 6.

In this example, first, on the lower electrode layer 24, a ferroelectric film to be a capacitor film is formed by sputtering method at a low temperature, for example 20° C. to 100° C., here 50° C., and thereby a ferroelectric film 62 in an amorphous state is formed with a film thickness of approximately 140 nm.

Subsequently, thermal treatment is performed by RTA method. The temperature of this thermal treatment is controlled so that the ferroelectric film 62 is crystallized completely in a portion on the lower electrode layer 24 (lower portion of the ferroelectric film 62), and a surface layer is in an amorphous state. At this time, the film thickness of the ferroelectric film 62 influences the crystal condition thereof.

Figure 17A:
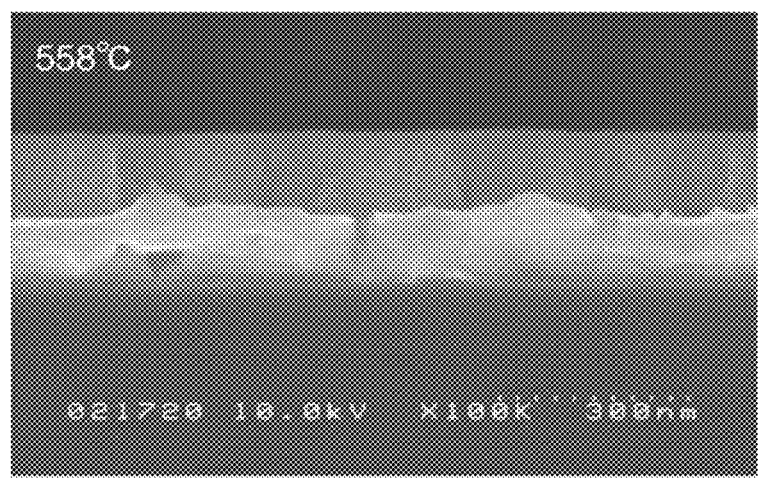
FIG. 17A is a picture of a cross section showing a state after performing thermal treatment on a PZT film with a film thickness of 140 nm formed on a lower electrode layer constituted of Pt, at 553° C. for 90 seconds by RTA method.
Figure 17B:
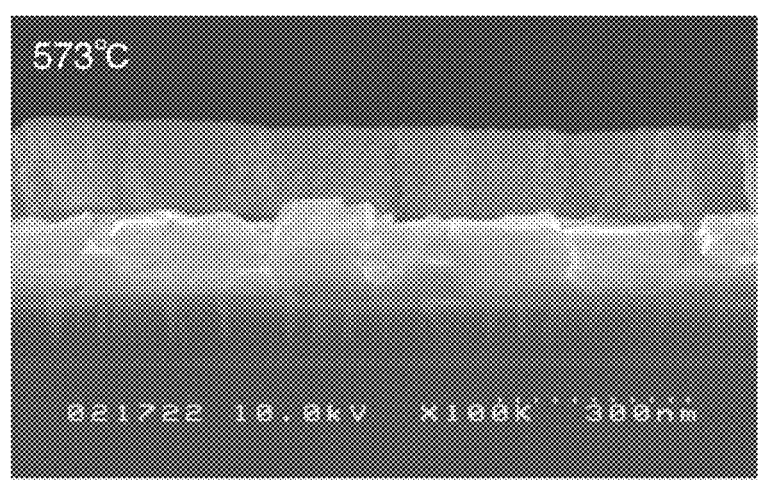
FIG. 17B is a picture of a cross section showing a state after performing thermal treatment on a PZT film with a film thickness of 140 nm formed on a lower electrode layer constituted of Pt, at 573° C. for 90 seconds by RTA method.

Generally, in a crystallization process of a ferroelectric film, crystallization proceeds from a portion on a lower electrode. When the thermal treatment temperature is high, the crystallization speed increases. FIG. 17A, FIG. 17B are pictures of cross sections showing states after performing thermal treatment on a PZT film with a film thickness of 140 nm formed on a lower electrode layer constituted of Pt, at 553° C. and 573° C. for 90 seconds by RTA method. When the annealing temperature is low, grain boundaries of columnar crystals cannot be seen in the vicinity of the surface, and it seems that the film is not crystallized. On the other hand, when the annealing temperature is high, grain boundaries of columnar crystals appear to be definite (in the case of a PZT film with a film thickness of 120 nm, when thermal treatment is performed at 568° C. for 90 seconds, grain boundaries of columnar crystals can be seen in the vicinity of the surface).

Subsequently, on the ferroelectric film 62, an $IrO_x$ film (0<x<2) 26c with a film thickness of approximately 20 nm to 80 nm, here approximately 50 nm, is formed by sputtering method or MOCVD method for example. Here, to control the value of x in the $IrO_x$ film 26c, the power applied to the semiconductor substrate 10 is set to 2.0 kW in an atmosphere of oxygen at a flow rate of 50 sccm to 58 sccm and Ar at a flow rate of 100 sccm. The value of x of the formed $IrO_x$ film 26c becomes approximately 1.4 for example.

Subsequently, thermal treatment is performed by RTA method. Concretely, it is performed at a treatment temperature of 725° C. in an oxidizing atmosphere, hear an atmosphere including oxygen (mixed atmosphere with oxygen at a flow rate of 20 sccm and Ar at a flow rate of 2000 sccm) for a thermal treatment time of 120 seconds.

By this thermal treatment, the ferroelectric film 62 crystallizes completely, and Ir in the $IrO_x$ film 26c diffuses into the ferroelectric film 62. Further, plasma damage on the $IrO_x$ film 26c is recovered, and oxygen deficiency in the ferroelectric film 62 is compensated. Moreover, the interface between the ferroelectric film 62 and the IrO$_x$ film 26c becomes flat (which is highly advantageous for low voltage operation).

Thereafter, similarly to the first embodiment, the IrO$_y$ film 26b is formed and patterned to thereby form a ferroelectric capacitor structure 30.

Figure 16:
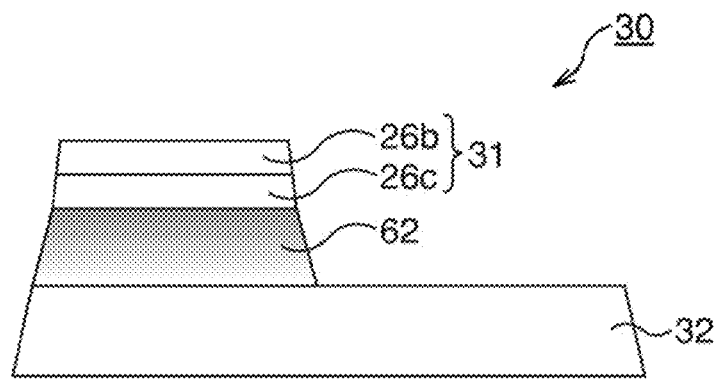
FIG. 16 is a schematic cross-sectional view showing a capacitor structure of an FeRAM of the example 6 according to the third embodiment.

In the ferroelectric capacitor structure 30 according to this example, as shown in FIG. 16, the ferroelectric film 62 contains iridium inside and has an iridium concentration distribution such that the iridium concentration gets lower with distance from an upper face toward a lower face.

Hereinafter, the mechanism of the present embodiment will be explained using a structure constituted of a Pt layer to be a lower electrode, an amorphous PZT film to be a capacitor film, and an IrO$_x$ film (x=1.4; hereinafter it is IrO$_{1.4}$ film) to be a part of an upper electrode.

The Pt lower electrode layer is oriented in (111) plane. The amorphous PZT film is formed thereon with a film thickness of 150 nm. Thereafter, thermal treatment is performed by RTA method in an atmosphere of oxygen at a flow rate of 25 sccm and Ar at a flow rate of 2000 sccm for 90 seconds.

Figure 18A:
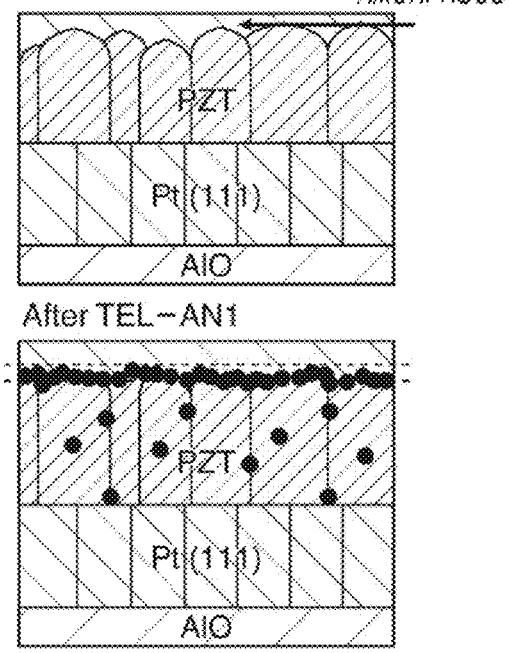
FIG. 18A is a schematic cross-sectional view showing the influence on cross-sectional views of a capacitor due to temperatures of the thermal treatment.
Figure 18B:
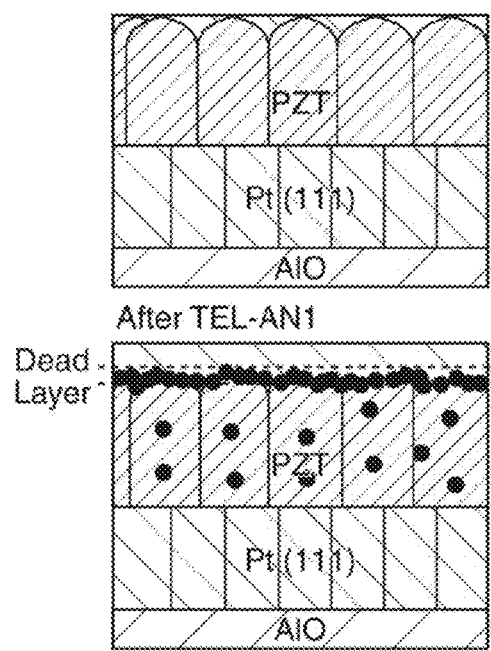
FIG. 18B is a schematic cross-sectional view showing the influence on cross-sectional views of a capacitor due to temperatures of the thermal treatment.
Figure 18C:
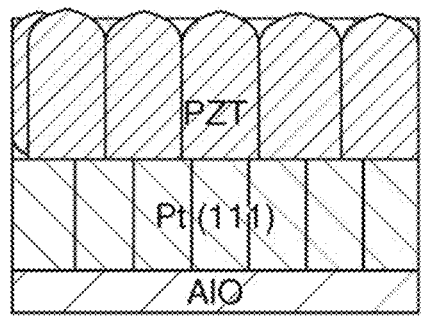
FIG. 18C is a schematic cross-sectional view showing the influence on cross-sectional views of a capacitor due to temperatures of the thermal treatment.
Figure 18C:
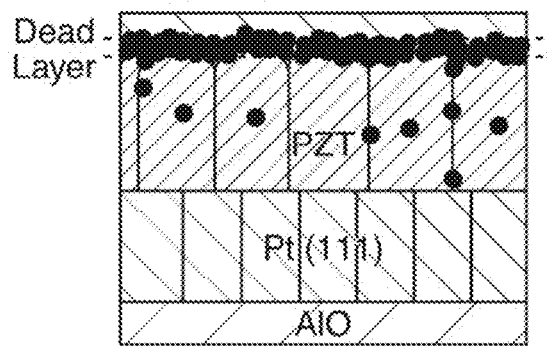
Figure 19A:
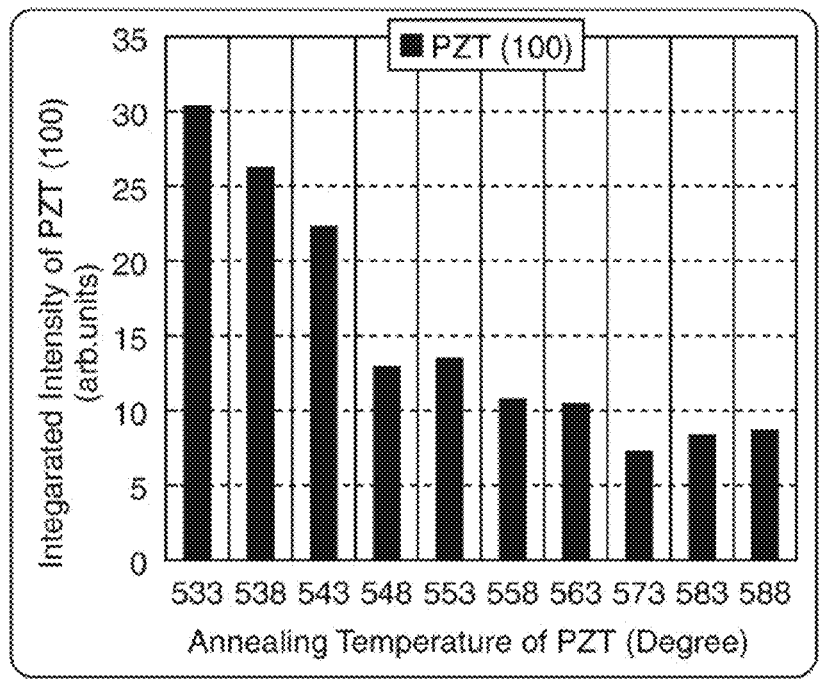
FIG. 19A is a characteristic chart showing results of measuring the crystallinity of a thermally treated CSPLZT film.
Figure 19B:
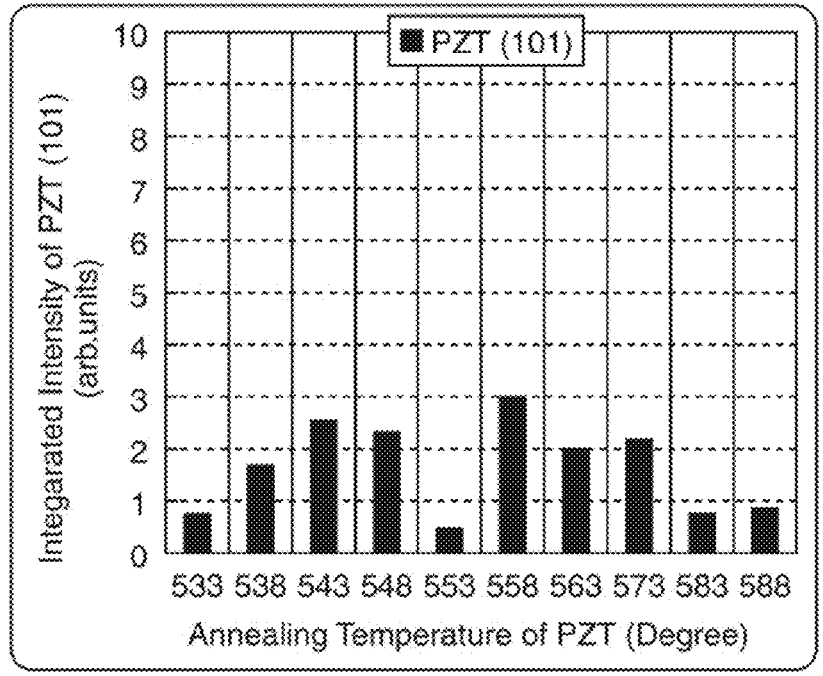
FIG. 19B is a characteristic chart showing results of measuring the crystallinity of the thermally treated CSPLZT film.
Figure 20A:
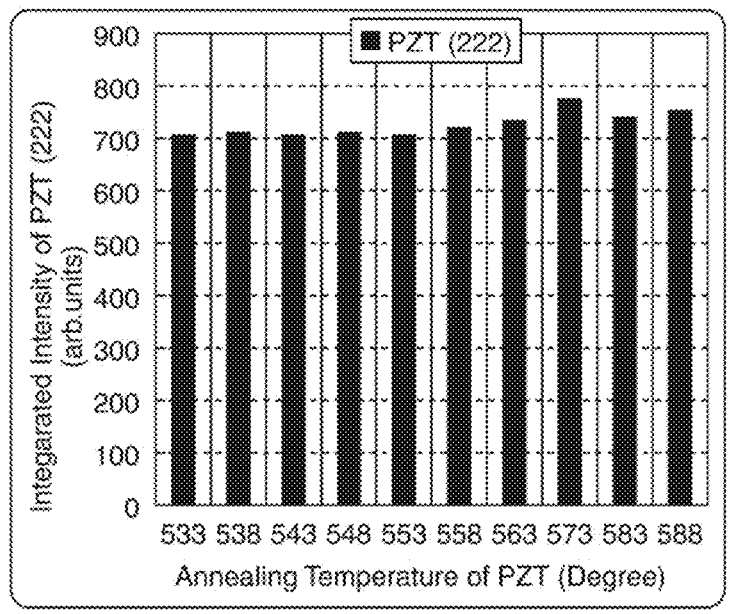
FIG. 20A is a characteristic chart showing results of measuring the crystallinity of the thermally treated CSPLZT film.
Figure 20B:
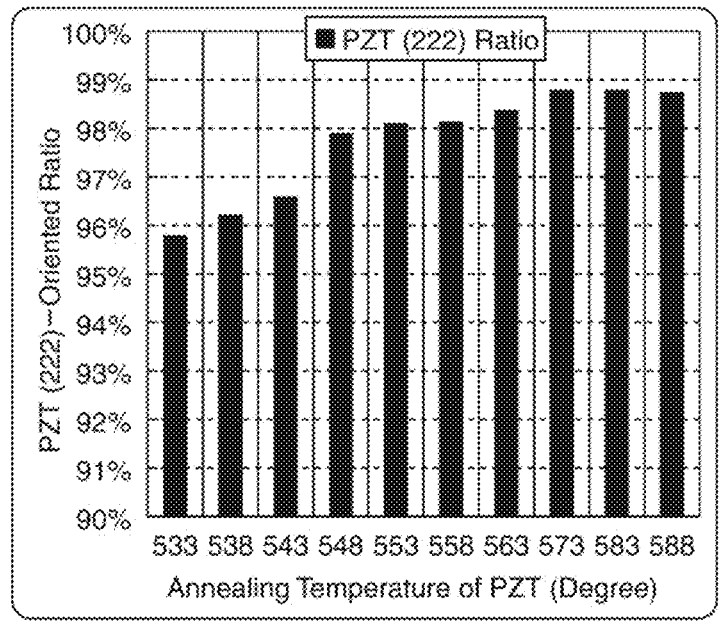
FIG. 20B is a characteristic chart showing results of measuring the crystallinity of the thermally treated CSPLZT film.

The influence on cross-sectional views of a capacitor due to temperatures of the thermal treatment are shown in FIG. 18A, FIG. 18B, FIG. 18C.

Crystal growth of the PZT film begins from a place between (111) crystal grains of the Pt lower electrode layer. When the temperature of the thermal treatment is low, the crystal growth of the PZT film varies widely, and also a quite wide variation in sizes of PZT crystal grains in columnar shapes can be seen. The surface of the PZT film is in an amorphous state.

Thereafter, the IrO$_{1.4}$ film is formed, and thermal treatment is further performed by RTA method at 725° C. in an atmosphere of oxygen at a flow rate of 20 sccm and Ar at a flow rate of 2000 sccm for 20 seconds. At this time, the IrO$_{1.4}$ film is an unsaturated film, and hence Ir in the IrO$_{1.4}$ film diffuses into the PZT film and Pb in the PZT film diffuses into the IrO$_{1.4}$ film. At this time, since the crystal grains in the PZT film varies widely, Ir is doped in the crystal grains (A site or B site) of the PZT film, and also a large amount of Ir remains in gaps between the crystal grains of the PZT film. It can be determined that such Ir forms a leak path in the capacitor. However, an interface layer (paraelectric layer) between the PZT film and the IrO$_{1.4}$ film becomes thin due to the influence of mutual diffusion between Pb and Ir. In other words, it is advantageous for low voltage operation of the capacitor structure.

On the other hand, when the thermal treatment temperature after forming the PZT film is appropriate, the crystal grains of the PZT film become almost even, and the surface layer of the PZT film turns to an amorphous state. Thereafter, when formation and thermal treatment of the Ir$_{1.4}$ film are performed, diffusion of Pb and Ir can be controlled, and the interface layer between the PZT film and the IrO$_{1.4}$ film can be made thin. At the same time, since the crystal grains of the PZT film become almost even, Ir hardly stays in the crystal grains of the PZT film, and the leak current in the capacitor structure becomes low.

Further, when the thermal treatment temperature after forming the PZT film becomes high, crystal growth of PZT becomes fast, and a certain degree of variation occurs in the crystal growth. At this time, the surface layer of the PZT film is not in an amorphous state, and the PZT film is crystallized completely. Thereafter, when formation and thermal treatment of the IrO$_{1.4}$ film are performed, mutual diffusion of Pb and Ir occurs. However, since the PZT film is crystallized, Ir can hardly diffuse into the crystal grains of the PZT film, and Ir stays between the crystal grains and between the PZT film and the IrO$_{1.4}$ film. The interface layer between the PZT film and the IrO$_{1.4}$ film becomes thick.

The above embodiments are thought out based on the above basic idea. In other words, it is an approach to realize that, by doping a minute amount of Ir into a ferroelectric film, defects in the ferroelectric film are compensated, the crystallinity of the ferroelectric film becomes even, staying of Ir between crystal grains of the ferroelectric film does not happen, and moreover the interface layer between the ferroelectric film and an upper electrode is made thin.

Here, the following experiment is performed by the approach of the example 6.

As the lower electrode of the capacitor structure, Pt (formed with a film thickness 150 nm at 350° C. by formation power of 0.3 kW) is used. As the ferroelectric film, a target of PZT to which minute amounts of Ca, Sr, La are added is used to form a CSPLZT film in an amorphous state by RF sputtering method with a film thickness of 150 nm on the aforementioned lower electrode. This CSPLZT film in an amorphous state is thermally treated by RTA method. It is performed in a mixed atmosphere of oxygen at a flow rate of 25 sccm and Ar at a flow rate of 2000 sccm for a thermal treatment time of 90 seconds. Thermal treatment temperatures from 533° C. to 588° C. are examined. As the IrO$_{1.4}$ film, a film is formed in a mixed atmosphere with oxygen at a flow rate of 50 sccm to 58 sccm and Ar at a flow rate of 100 sccm for eight seconds at a substrate temperature of 20° C. by power of 2.0 kW applied to the semiconductor substrate. Thus, the IrO$_{1.4}$ film with a film thickness of approximately 47 nm is formed. Thereafter, thermal treatment is performed by RTA method at 725° C. for 20 seconds in a mixed atmosphere of oxygen at a flow rate of 20 sccm and Ar at a flow rate of 2000 sccm.

Results of measuring the crystallinity of the CSPLZT film thermally treated as above are shown in FIG. 19A, FIG. 19B, FIG. 20A, FIG. 20B.

As shown in the charts, a (101) surface of the CSPLZT film under each condition has almost no orientation (influence of background level). When the thermal treatment temperature is low, the orientation of a (100) surface becomes strong, and when the thermal treatment temperature is high, the orientation intensity of a (222) surface becomes high. On the other hand, when the thermal treatment temperature is low, the orientation ratio (=(222)/[(222)+(100)+(101)]) of the (222) surface of the CSPLZT film is low. When the thermal treatment temperature is 548° C. or higher, the orientation ratio of the (222) surface is mostly saturated. From the above results, it can be seen that the crystallinity of the CSPLZT film mostly depends on the thermal treatment condition after forming the ferroelectric. In other words, when the thermal treatment temperature is low, the crystallinity of the CSPLZT film is poor, and the sizes of crystal grains vary. When the thermal treatment temperature is 548° C. or higher, the sizes of the crystal grains of the CSPLZT film becomes almost even.

Figure 21A:
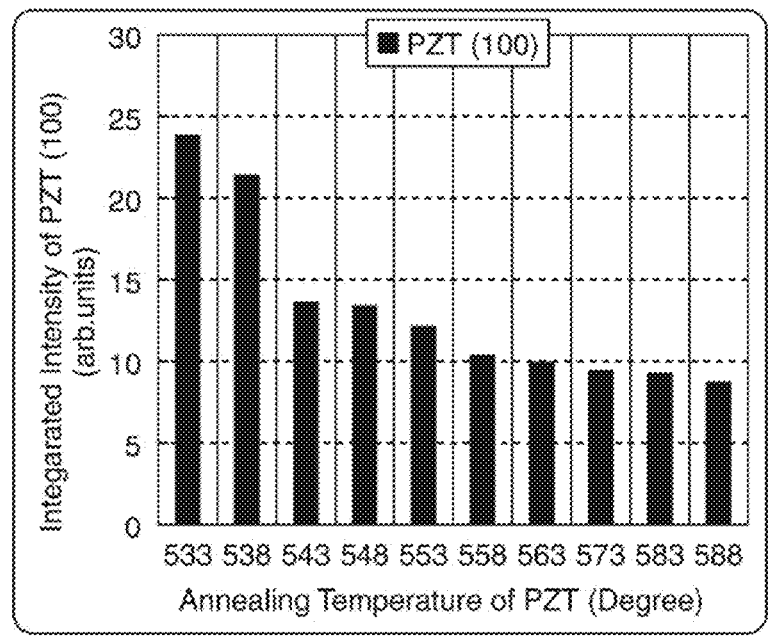
FIG. 21A is a characteristic chart showing the influence of thermal treatment temperatures on the crystallinity of the CSPLZT film when the film thickness of the CSPLZT is 120 nm.
Figure 21B:
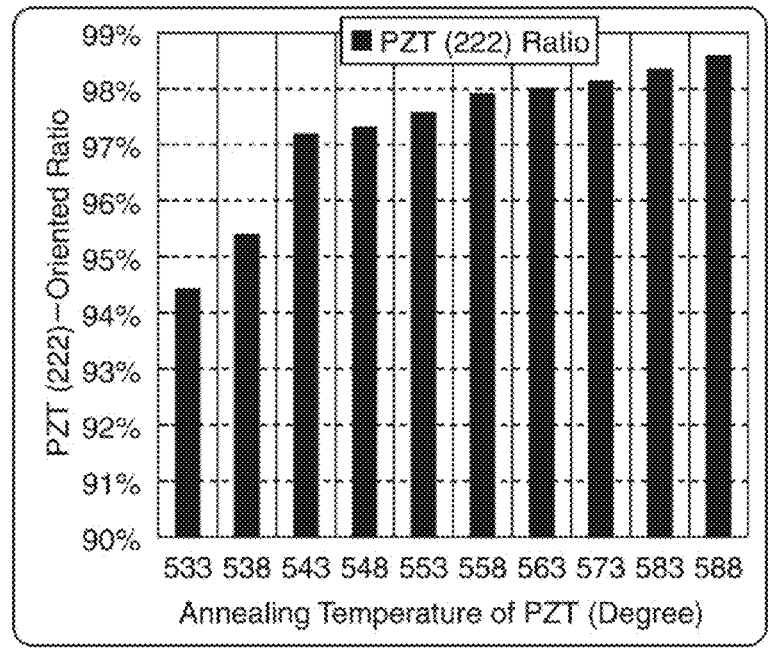
FIG. 21B is a characteristic chart showing the influence of thermal treatment temperatures on the crystallinity of the CSPLZT film when the film thickness of the CSPLZT is 120 nm.

On the other hand, the crystallinity of the CSPLZT film depends on the film thickness and the thermal treatment temperature. The influence of thermal treatment temperatures when the film thickness of the CSPLZT is 120 nm on the crystallinity of the CSPLZT film is shown in FIG. 21A, FIG. 21B. When the thermal treatment temperature is low, the orientation intensity of the (100) surface becomes high, and the orientation ratio of the (222) surface becomes low. At approximately 543° C. or higher, the orientation ratio is mostly saturated. From these results, for the ferroelectric film, the optimum thermal treatment temperature becomes low when the film thickness becomes thin. In other words, the thermal treatment condition for equalizing the sizes and aligning the orientations of the crystal grains of the ferroelectric when turning the surface layer of the ferroelectric film into an amorphous state also depends on the film thickness of PZT.

A ferroelectric capacitor structure is formed with the CSPLZT film being a capacitor film, and the $IrO_{1.4}$ film and the $IrO_2$ film (with a film thickness of approximately 200 nm) being en upper electrode, wirings are formed up to three layers, and thereby one transistor/one capacitor (1T1C) FeRAM is completed. Next, the monitor characteristic and the PT yield of the completed 1T1C FeRAM were examined.

First, a ferroelectric capacitor (discrete) having a square planar shape with one side being 50 μm and 1428 ferroelectric capacitors (cell capacitors) each having a rectangular flat shape with long sides being 1.50 μm and short sides being 1.15 μm were formed, and inversion charge amounts QSW thereof were measured.

Figure 22A:
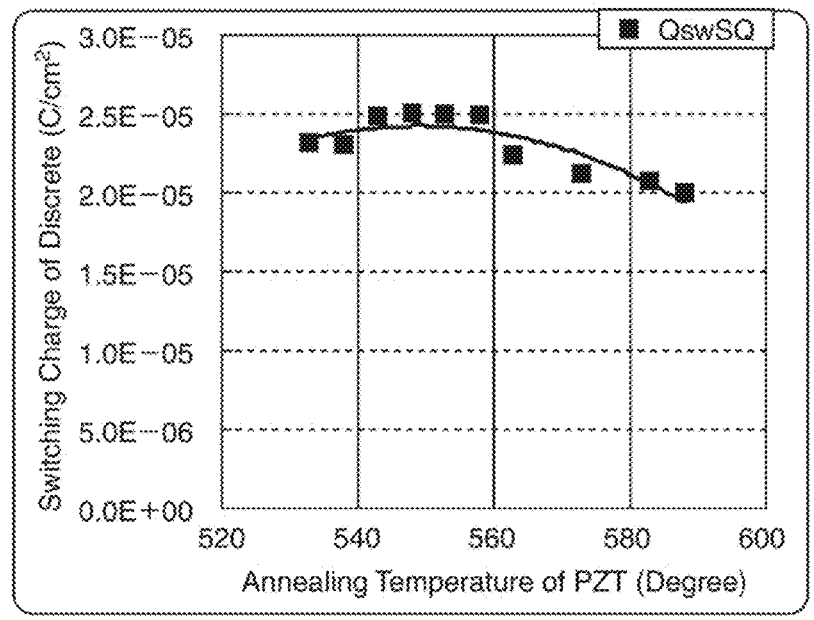
FIG. 22A is a characteristic chart showing results of measuring an inversion charge amount QSW with an applied voltage being 3.0V.
Figure 22B:
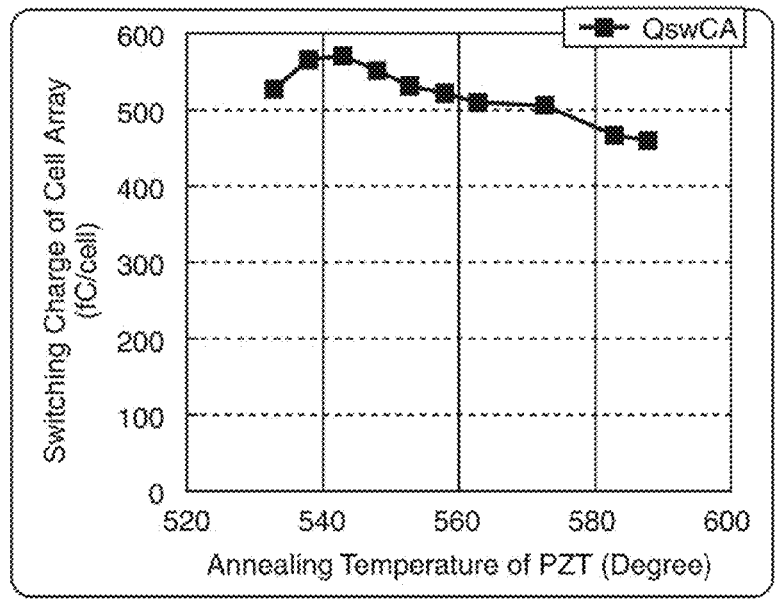
FIG. 22B is a characteristic chart showing results of measuring an inversion charge amount QSW with an applied voltage being 3.0V.

Results of measuring the inversion charge amounts QSW with the applied voltage being 3.0 V are shown in FIG. 22, FIG. 22B.

These results are average values at 56 points within the plane of the substrate. As shown in the charts, when the thermal treatment temperature of the CSPLZT film is 538° C. or below, the QSW of the discrete becomes low. They are substantially highest values from 543° C. to 558° C. Further, when the thermal treatment temperature becomes high, the QSW becomes low. The same tendency can be seen with the cell capacitors.

Figure 23A:
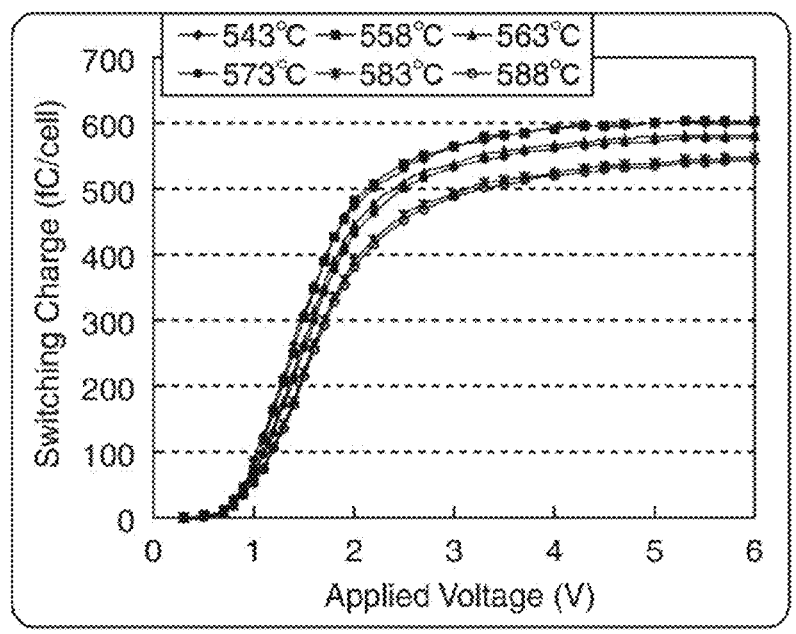
FIG. 23A is a characteristic chart showing dependence on an applied voltage in a cell capacitor.
Figure 23B:
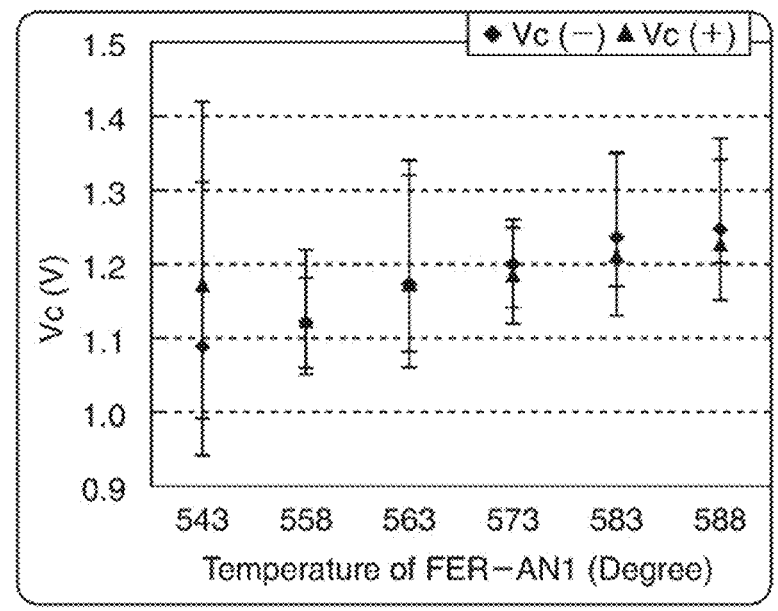
FIG. 23B is a characteristic chart showing a coercive voltage Vc of polarization inversion in the cell capacitor.

On the other hand, dependence on an applied voltage in the cell capacitors is shown in FIG. 23A, and the coercive voltage Vc of polarization inversion is shown in FIG. 23B.

Regarding this Vc, an applied voltage by which the ratio of change of a value P to change of the applied voltage is the largest is taken as the coercive voltage Vc. Note that a dark diamond indicates a coercive voltage (−) when the ratio of change is negative, and a dark triangle indicates a coercive voltage (+) when the ratio of change is positive. When Vc is low, a high inversion charge amount QSW was obtained and a gradient became large form a low voltage to a saturated voltage. This means that it is quite preferable for ferroelectric memory operating with low-voltage.

As shown in FIG. 23A and FIG. 23B, in the cell capacitors of 543° C. and 558° C., the start-up becomes quick at a low voltage, the saturation QSW becomes high, and Vc becomes small. When the thermal treatment temperature becomes high, the start-up becomes slow at a low voltage, the saturation QSW becomes low, and the Vc becomes high.

When the thermal treatment temperature is 560° C. or below, the surface of the CSPLZT film is in an amorphous state, and thereafter, when performing thermal treatment after the $IrO_{1.4}$ film is formed, Ir diffuses into the CSPLZT film. Moreover, the interface between the CSPLZT film and the $IrO_{1.4}$ film is planar, and a thin interface layer is generated. On the other hand, when the thermal treatment temperature is 563° C. or higher, the surface of the CSPLZT film is crystallized. At a further higher temperature, the CSPLZT film more completely crystallizes. In this case, by the thermal treatment after the $IrO_{1.4}$ film is formed, Ir diffuses into the CSPLZT film but hardly enters the crystal grains of the CSPLZT film, and stays in the crystal grain boundaries. Moreover, the interface layer between the CSPLZT film and the $IrO_{1.4}$ film becomes thick. In this situation, the polarization inversion charge amount becomes small and the coercive voltage becomes high.

Figure 24A:
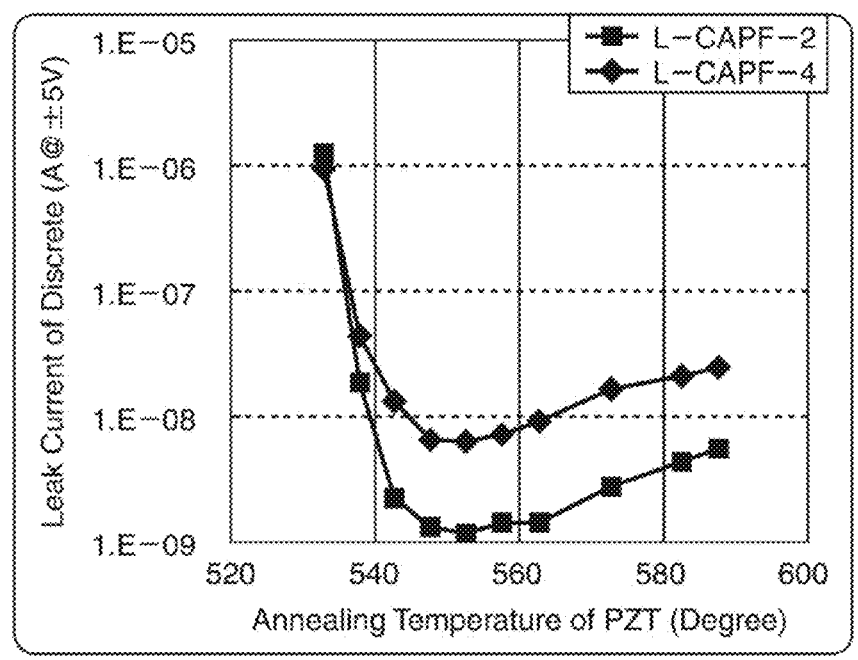
FIG. 24A is a characteristic chart showing results of measuring a leak current in ferroelectric capacitor structures (discrete)
Figure 24B:
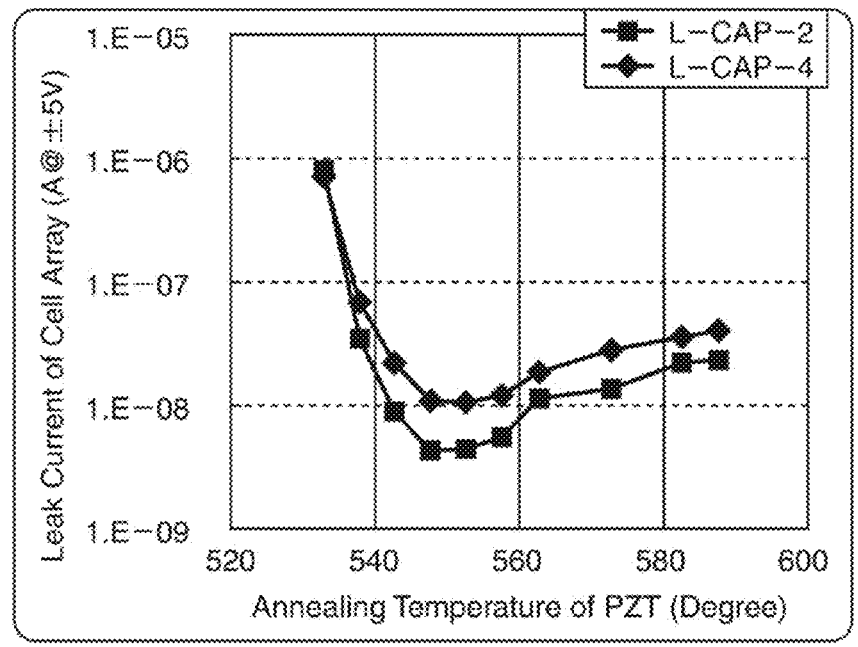
FIG. 24B is a characteristic chart showing results of measuring a leak current in ferroelectric capacitor structures (cell arrays)

Next, leak currents in the above ferroelectric capacitor structures (discrete and cell arrays) were measured. Results thereof are shown in FIG. 24A, FIG. 24B.

Note that the applied voltage corresponds to the potential of the lower electrode on the basis of the upper electrode, and is set to ±5 V. L-CAPF is a leak current in the discrete, and L-CAP is a leak current in the cell arrays. L-CAPF-2 is a leak current by an applied voltage +5 V in the discrete. As shown in the charts, when the thermal treatment temperature of PZT is 543° C. or below, each leak current increases rapidly. The leak current between 548° C. and 558° C. becomes the lowest. Further, when the thermal treatment temperature becomes high, a result that the leak current increases was obtained. This phenomenon can be explained as follows.

When the thermal treatment temperature is low, the crystal grain diameters of PZT vary widely, and there are many defects of grain boundaries. When Ir diffuses into PZT, it is filled in these vacant places. The Ir in the filled vacant places forms a leak path in the capacitor structure, and the leak current in the capacitor structure increases rapidly. When the thermal treatment temperature is appropriate, there are few defects in the grain boundaries of the CSPLZT film, and Ir diffuses into the crystal grains. Thus, the leak path of a capacitor is not formed. When the thermal treatment temperature becomes high, the crystal grains in PZT are formed completely, and Ir hardly enters the crystal grains and hence stays in the crystal grain boundaries as they are, thereby forming a leak path.

Figure 25A:
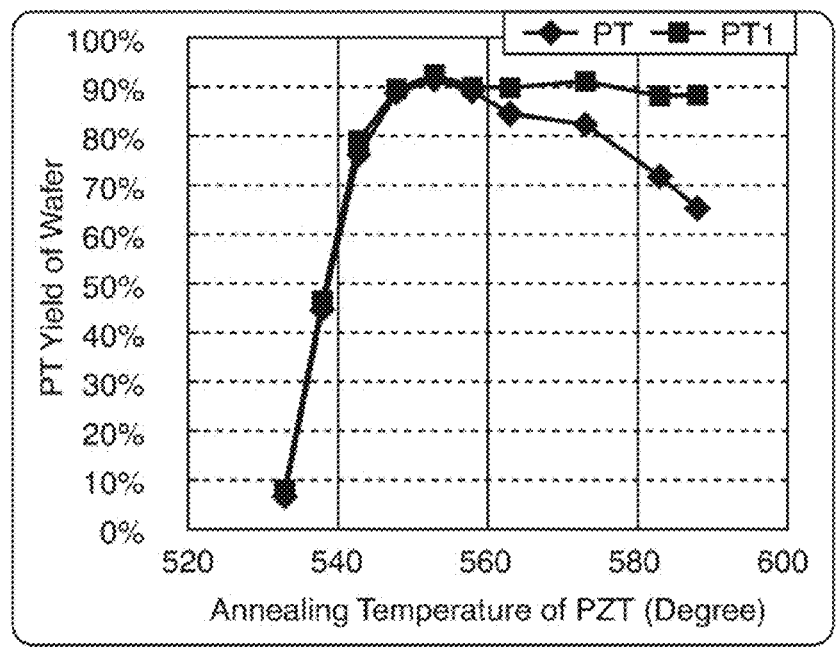
FIG. 25A is a characteristic chart showing measurement results of a yield in a ferroelectric capacitor structure (1T1C type cell array)
Figure 25B:
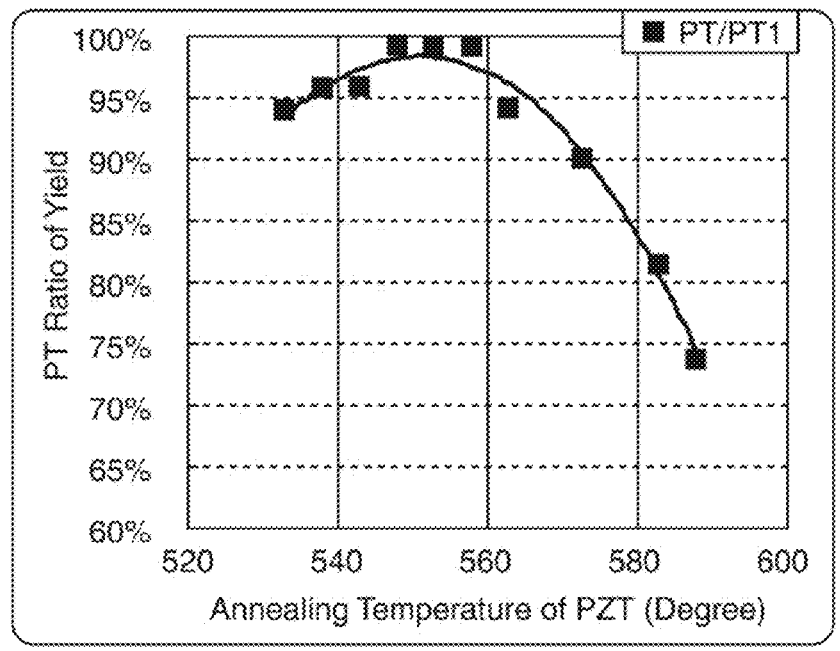
FIG. 25B is a characteristic chart showing measurement results of the yield in the ferroelectric capacitor structure (1T1C type cell array)

FIG. 25A, FIG. 25B are characteristic charts showing measurement results of a yield in the ferroelectric capacitor structure (1T1C type cell array).

For measuring the yield, the operating voltage is set to 3 V. PT1 denotes the yield when reading is performed after writing is performed. PT2 denotes the yield when thermal treatment is performed at 250° C. before reading. PT3 denotes the yield when reversing data after thermal treatment with respect to PT2. PT denotes the total yield of PT1, PT2, PT3. The PT ratio is PT/PT1.

Figure 26:
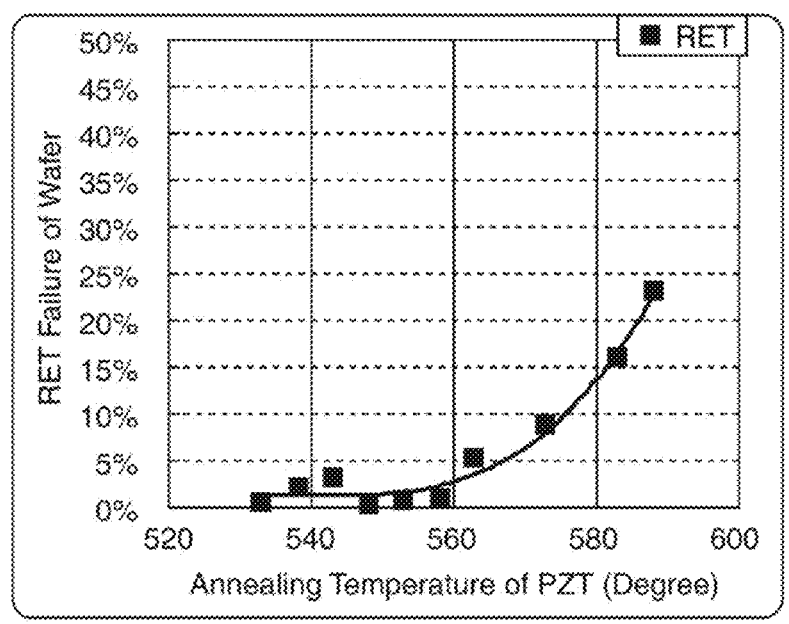
FIG. 26 is a characteristic chart showing results of RET failure (SS & OS) of a PT yield.

As shown in the charts, the thermal treatment temperature of PZT (CSPLZT) largely influences the yield of the device. When the thermal treatment temperature of PZT is low, a leak current in the capacitor is large, and hence a high voltage cannot be applied to the capacitor structure. Thus, the yield of PZ1 becomes very low. On the other hand, when the thermal treatment temperature of PZT becomes high, the capacitor structure becomes difficult to operate by a low voltage, retention (SS: Same State defect) and imprint (OS: Opposite State defect) easily occur therein, and PT becomes low. Similarly, the PT ratio becomes low. Results of the RET failure (SS & OS) of the PT yield are shown in FIG. 26.

From the above results, it is desirable that the thermal treatment temperature for PZT (CSPLZT) film is between 543° C. and 573° C. The optimum temperature is 553° C. Further, by thermal treatment between 548° C. and 558° C, the device yield of 90% and a yield ratio of 98% or higher can be obtained.

On the other hand, when the film thickness of PZT is 120 nm, it is conceivable that the optimum thermal treatment temperature is between 543° C. and 553° C.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

INDUSTRIAL APPLICABILITY

According to the present embodiment, an inversion charge amount in a capacitor structure is improved without increasing a leak current pointlessly, and a high yield can be assured. Thus, a highly reliable semiconductor device is realized.

What is claimed is

1. A method of manufacturing a semiconductor device having a capacitor structure sandwiching a capacitor film constituted of a dielectric material by a lower electrode and an upper electrode above a semiconductor substrate, the method comprising, when forming the capacitor structure, the steps of:

forming a lower electrode layer;

forming a dielectric film in an amorphous state on the lower electrode layer;

performing first thermal treatment on the dielectric film in an oxidizing atmosphere to crystallize the dielectric film;

forming on the dielectric film an upper electrode layer containing iridium inside;

performing second thermal treatment on the upper electrode layer in an oxidizing atmosphere to cause iridium in the upper electrode layer to diffuse into the dielectric film; and processing each of the upper electrode layer, the dielectric film, and the lower electrode layer to form the capacitor structure.

2. The method of manufacturing the semiconductor device according to claim 1, wherein the upper electrode layer is a multilayered structure, a lowest layer of the upper electrode layer is formed with composition of $IrO_x$ ($0<x<2$) on the dielectric film, the second thermal treatment is performed on the lowest layer to cause iridium in the lowest layer to diffuse into the dielectric film, and thereafter a remaining layer of the upper electrode layer is formed on the lowest layer to thereby complete the upper electrode layer.

* * * * *